(12) United States Patent
Konishi

(10) Patent No.: US 12,338,974 B2
(45) Date of Patent: Jun. 24, 2025

(54) LIGHT SOURCE UNIT AND ROAD ILLUMINATION DEVICE EQUIPPED WITH LIGHT SOURCE UNIT

(71) Applicant: DENKA COMPANY LIMITED, Tokyo (JP)

(72) Inventor: Masahiro Konishi, Tokyo (JP)

(73) Assignee: DENKA COMPANY LIMITED, Tokyo (JP)

( * ) Notice: Subject to any disclaimer, the term of this patent is extended or adjusted under 35 U.S.C. 154(b) by 0 days.

(21) Appl. No.: 18/282,830

(22) PCT Filed: Mar. 11, 2022

(86) PCT No.: PCT/JP2022/010884
§ 371 (c)(1),
(2) Date: Sep. 19, 2023

(87) PCT Pub. No.: WO2022/202399
PCT Pub. Date: Sep. 29, 2022

(65) Prior Publication Data
US 2024/0167651 A1    May 23, 2024

(30) Foreign Application Priority Data

Mar. 22, 2021   (JP) ................. 2021-047599

(51) Int. Cl.
*F21S 8/08*    (2006.01)
*F21V 5/04*    (2006.01)
(Continued)

(52) U.S. Cl.
CPC ............... *F21S 8/08* (2013.01); *F21V 5/04* (2013.01); *F21V 9/32* (2018.02); *F21V 19/001* (2013.01); *F21V 29/67* (2015.01); *F21V 29/70* (2015.01)

(58) Field of Classification Search
CPC . F21V 29/67; F21V 29/70; F21V 9/32; F21V 5/04; F21V 19/001; F21S 8/08
See application file for complete search history.

(56) References Cited

U.S. PATENT DOCUMENTS

| | | | |
|---|---|---|---|
| 7,422,347 B2 | 9/2008 | Miyairi et al. | |
| 8,240,886 B2 * | 8/2012 | Lai ........................ | F21V 7/04 362/309 |

(Continued)

FOREIGN PATENT DOCUMENTS

| | | |
|---|---|---|
| JP | 2006-286608 A | 10/2006 |
| JP | 2009-99492 A | 5/2009 |

(Continued)

OTHER PUBLICATIONS

May 10, 2022 International Search Report issued in International Patent Application No. PCT/JP2022/010884.

(Continued)

*Primary Examiner* — Christopher E Dunay
(74) *Attorney, Agent, or Firm* — Oliff PLC

(57) ABSTRACT

A light source unit includes a light emitting module which has a printed wiring board and a plurality of light emitting diode elements mounted on the board, and a light-transmissive light distribution adjustment portion which covers the light emitting module, in which the board has a fluorescent layer containing fluorescent particles over a surface on which the light emitting diode elements are mounted, and the light distribution adjustment portion includes a portion having a convex shape outward from the board side, is spaced apart from the plurality of light emitting diode elements and from the fluorescent layer, commonly covers the plurality of light emitting diode elements and the fluo- (Continued)

rescent layer, and diffuses and distributes emission light from the light emitting diode elements and luminescence from the fluorescent layer.

24 Claims, 25 Drawing Sheets

(51) Int. Cl.
*F21V 9/32* (2018.01)
*F21V 19/00* (2006.01)
*F21V 29/67* (2015.01)
*F21V 29/70* (2015.01)

(56) References Cited

U.S. PATENT DOCUMENTS

| | | | | |
|---|---|---|---|---|
| 9,494,305 | B2* | 11/2016 | Tischler | F21V 21/14 |
| 9,533,245 | B2* | 1/2017 | Nakatani | D04H 1/54 |
| 10,431,568 | B2* | 10/2019 | Gould | H01L 33/505 |
| 10,468,565 | B2* | 11/2019 | Pun | H01L 25/0753 |
| 10,539,291 | B2* | 1/2020 | Chen | F21V 5/002 |
| 10,790,420 | B2* | 9/2020 | Jiang | F21K 9/232 |
| 2006/0198144 | A1 | 9/2006 | Miyairi et al. | |
| 2017/0146198 | A1* | 5/2017 | Nielsen-Williams | F21V 3/0625 |
| 2022/0278257 | A1 | 9/2022 | Konishi | |

FOREIGN PATENT DOCUMENTS

| | | |
|---|---|---|
| JP | 2012-114001 A | 6/2012 |
| JP | 2012-175013 A | 9/2012 |
| JP | 2014-102485 A | 6/2014 |
| JP | 2015-153639 A | 8/2015 |
| WO | 2020/137762 A1 | 7/2020 |

OTHER PUBLICATIONS

Jul. 2, 2024 Office Action issued in Japanese Patent Application No. 2023-509015.

* cited by examiner

[FIG. 1]
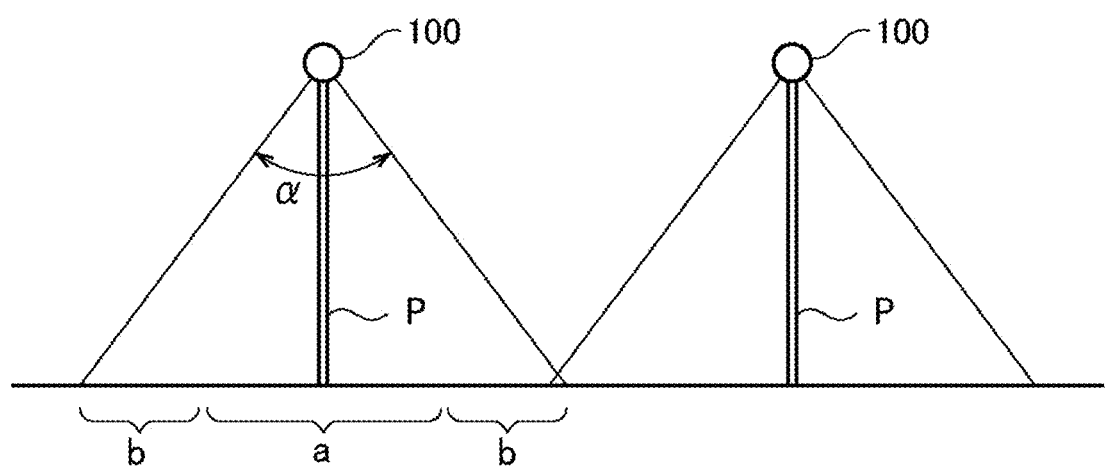

[FIG. 2]
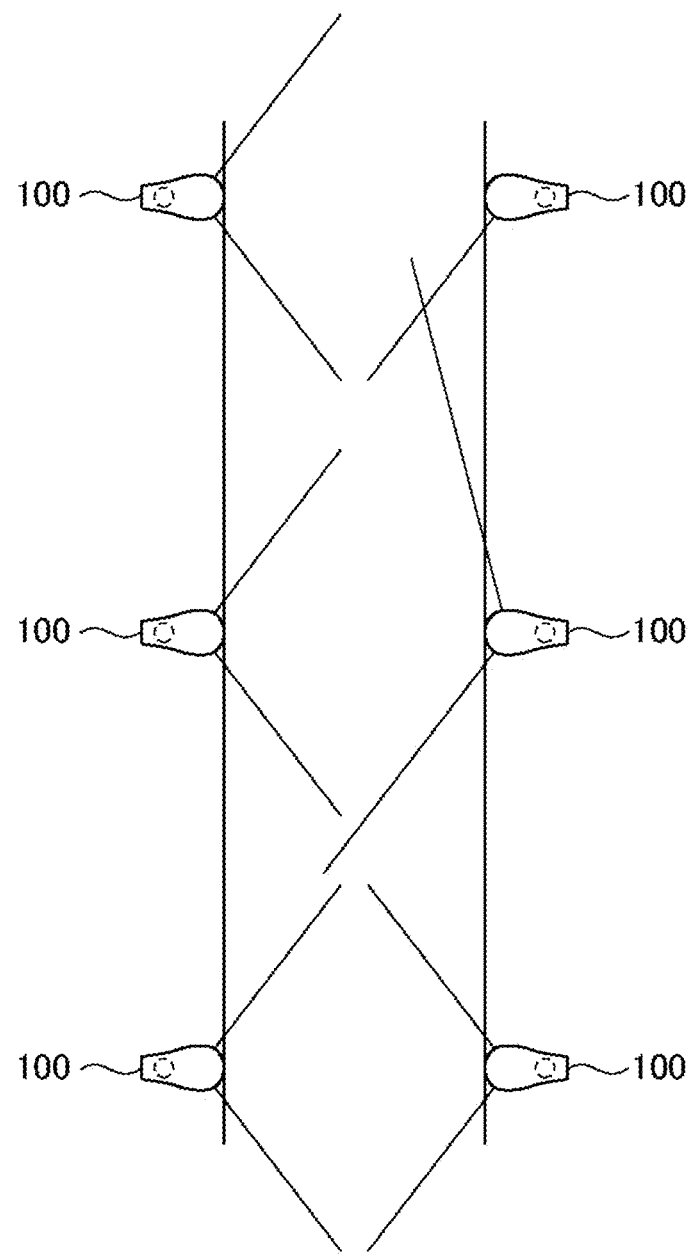

[FIG. 3]
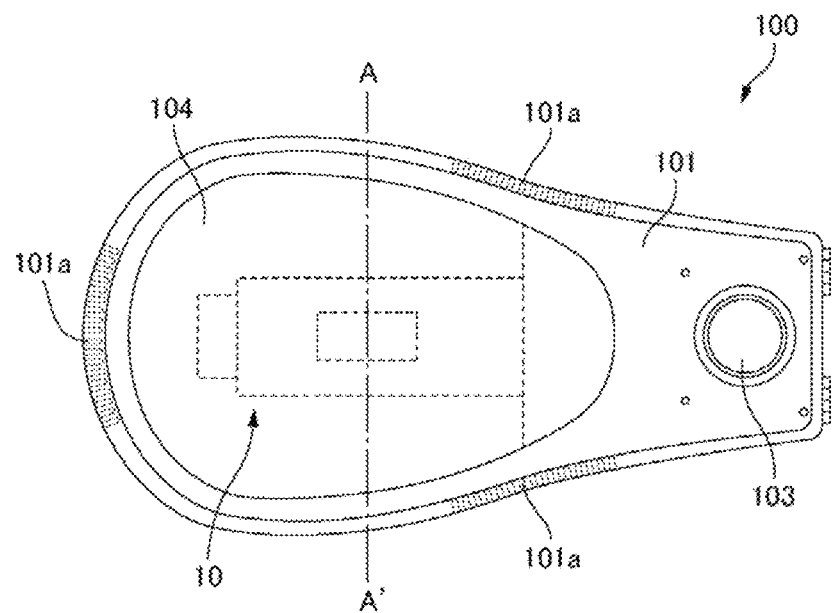
[FIG. 4]
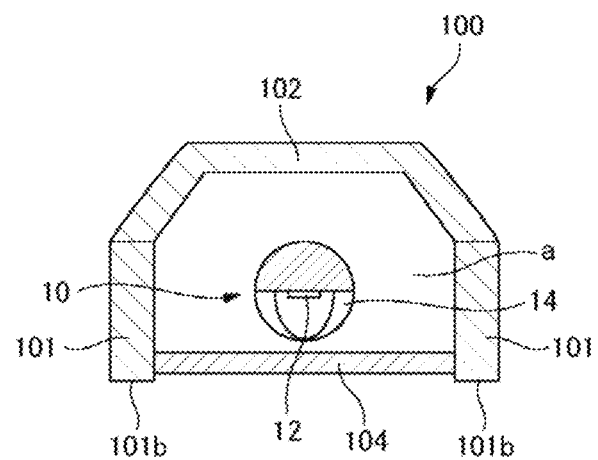

[FIG. 5]
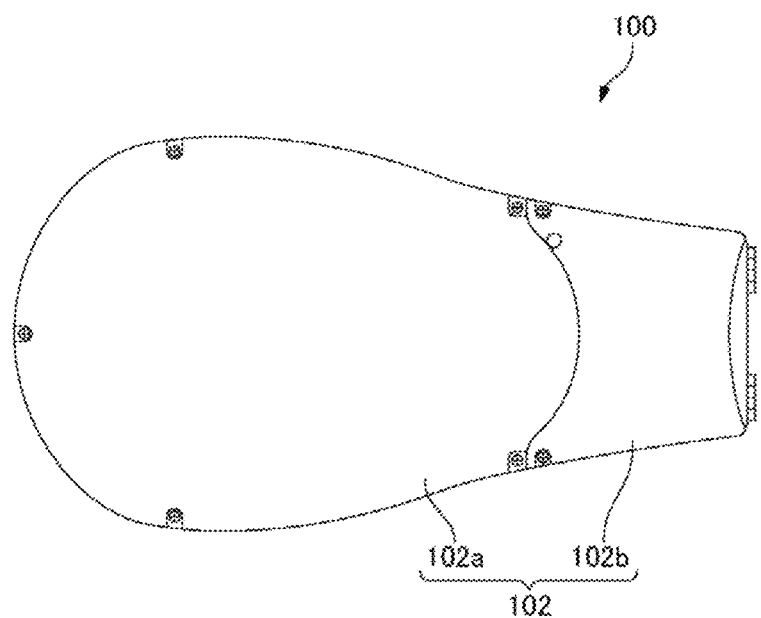
[FIG. 6]
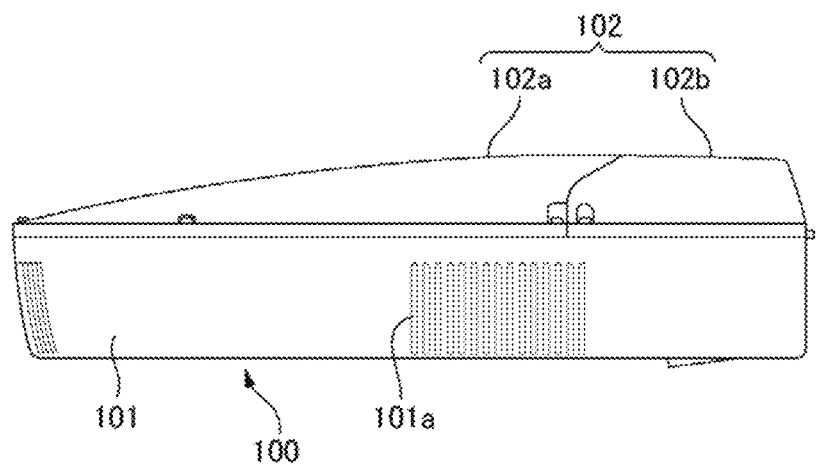

[FIG. 7]
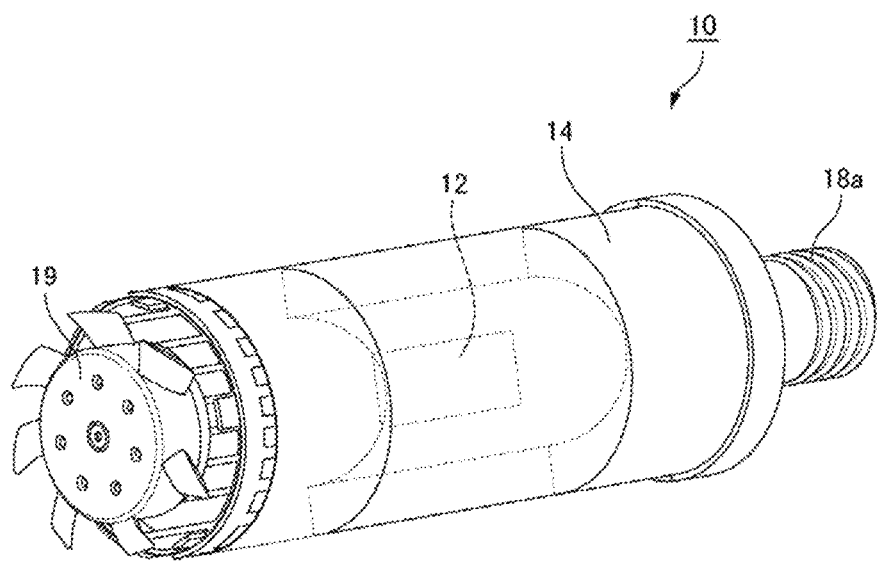
[FIG. 8]
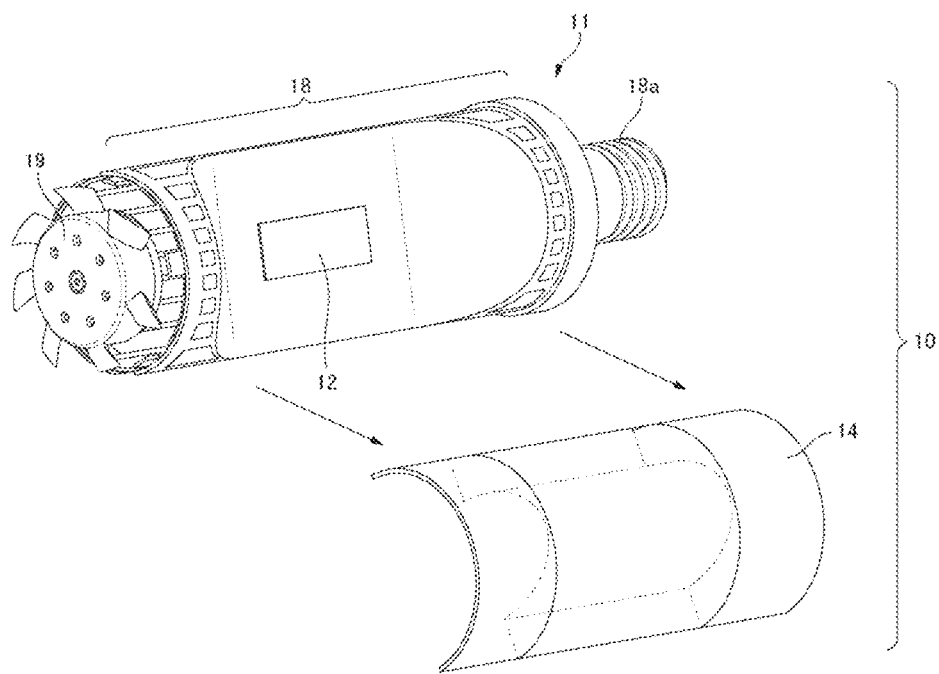

[FIG. 9]
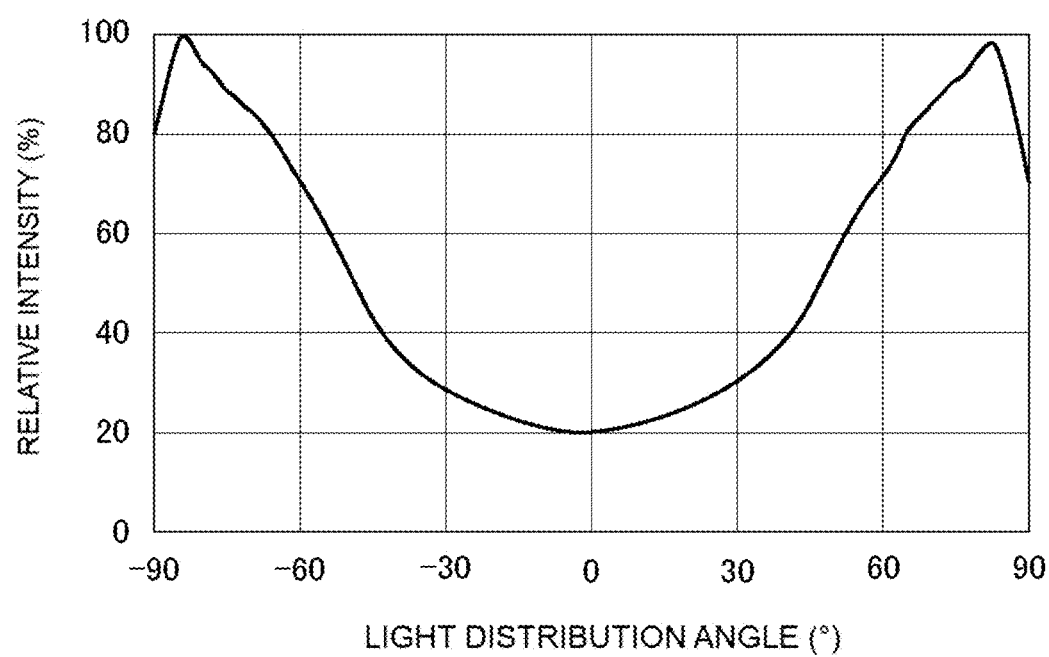

[FIG. 10]
(a)
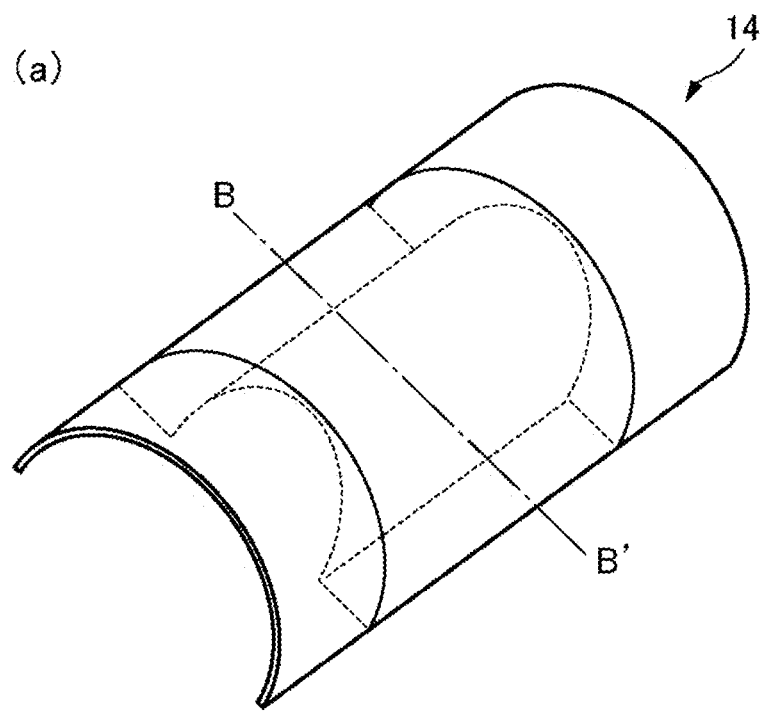
(b)
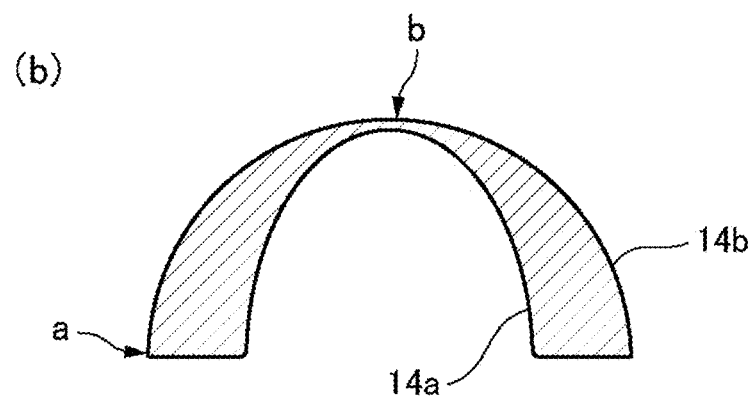

[FIG. 11]
(a)
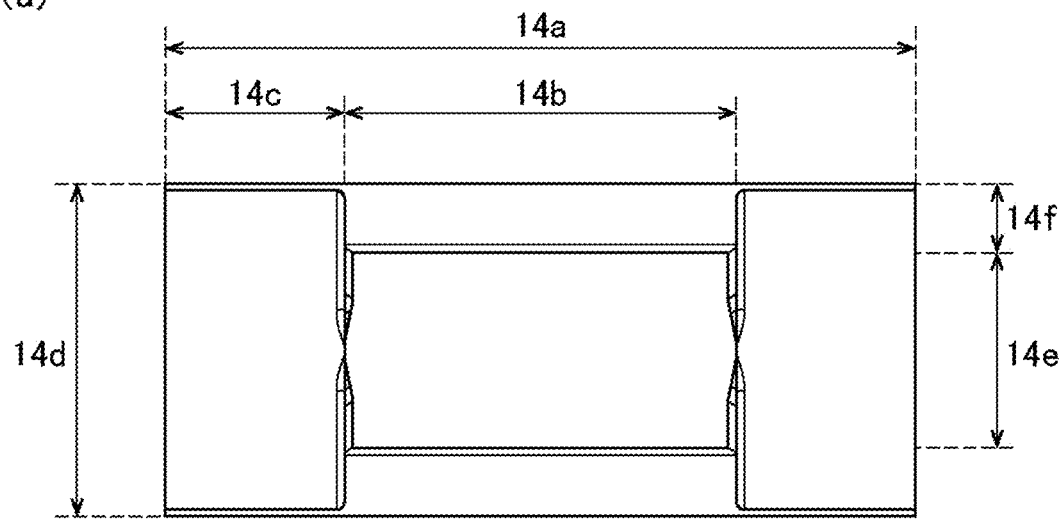
(b)

[FIG. 12]
(a)
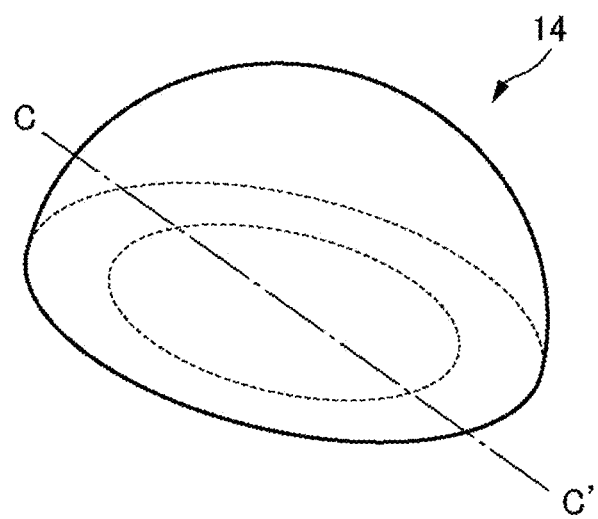
(b)
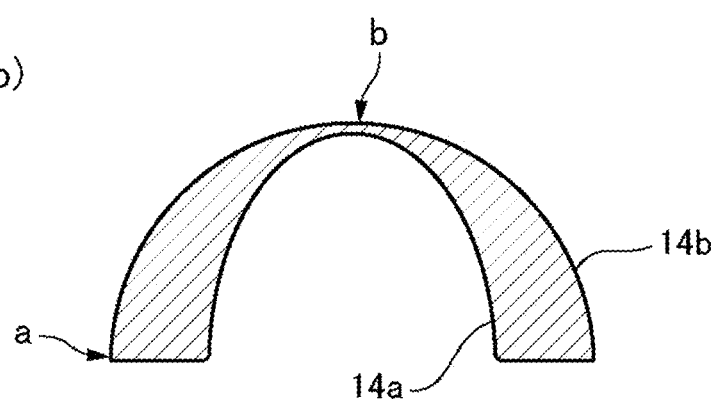

[FIG. 13]
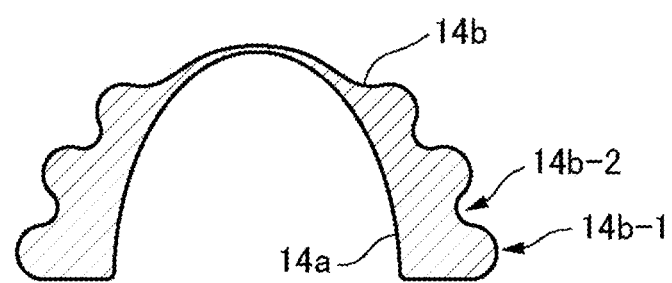
[FIG. 14]
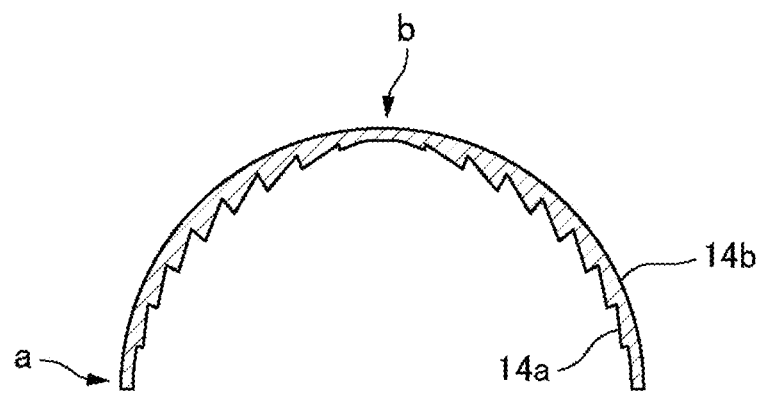

[FIG. 15]
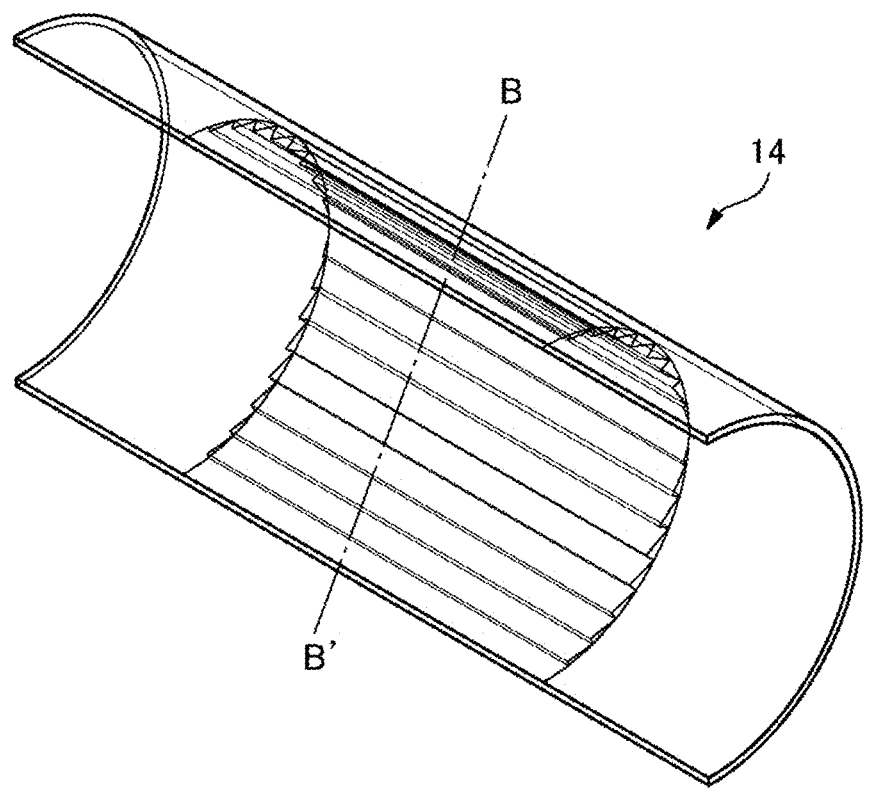

[FIG. 16]
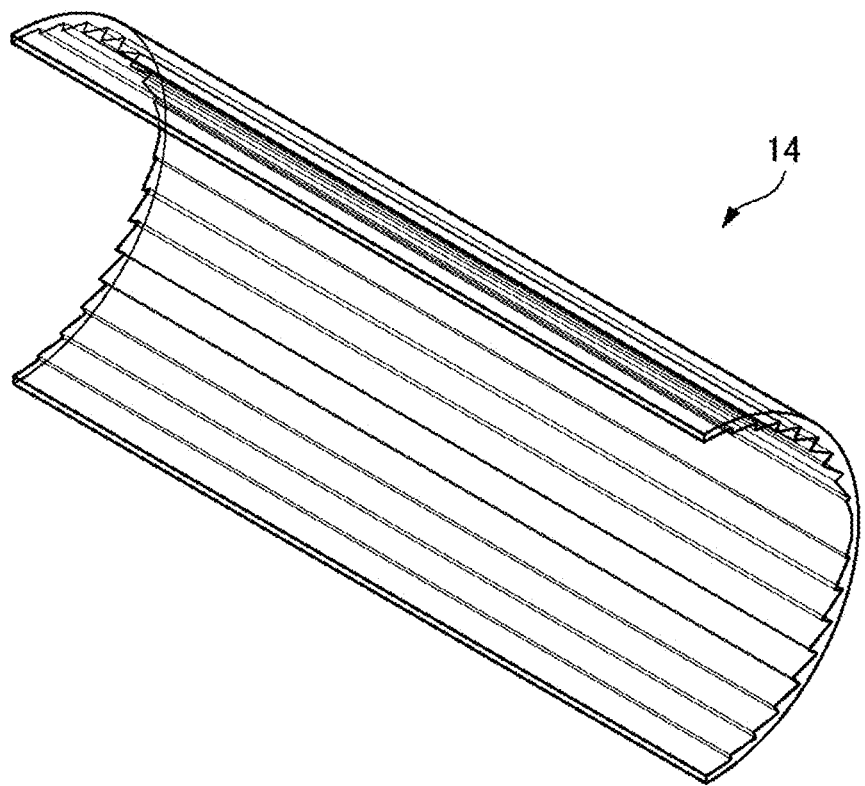

[FIG. 17]
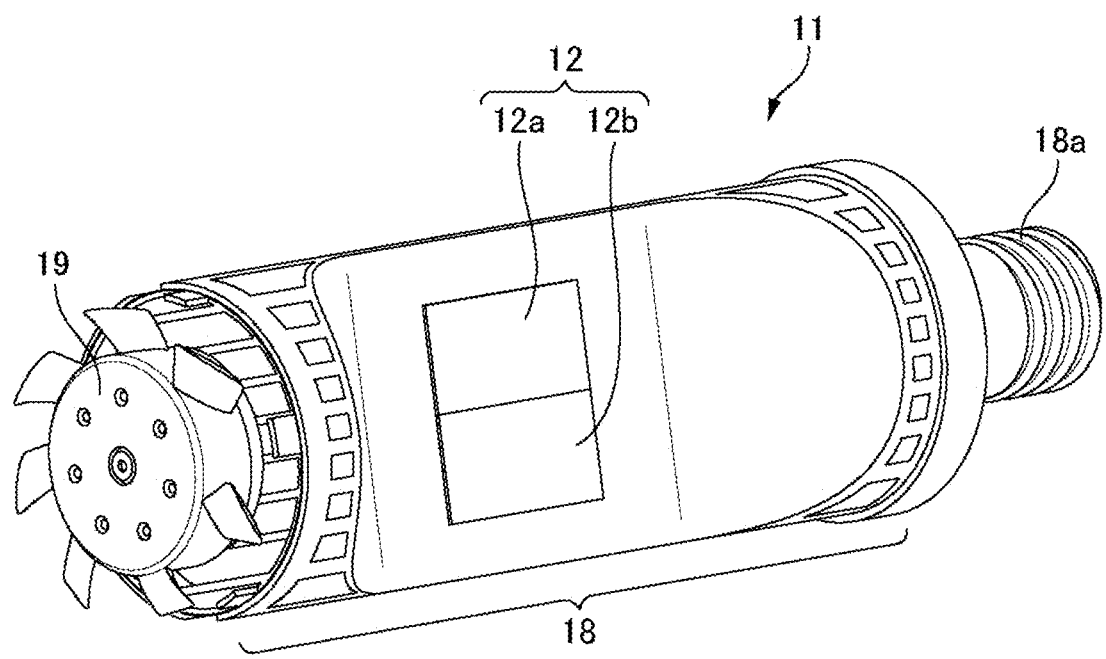

[FIG. 18]
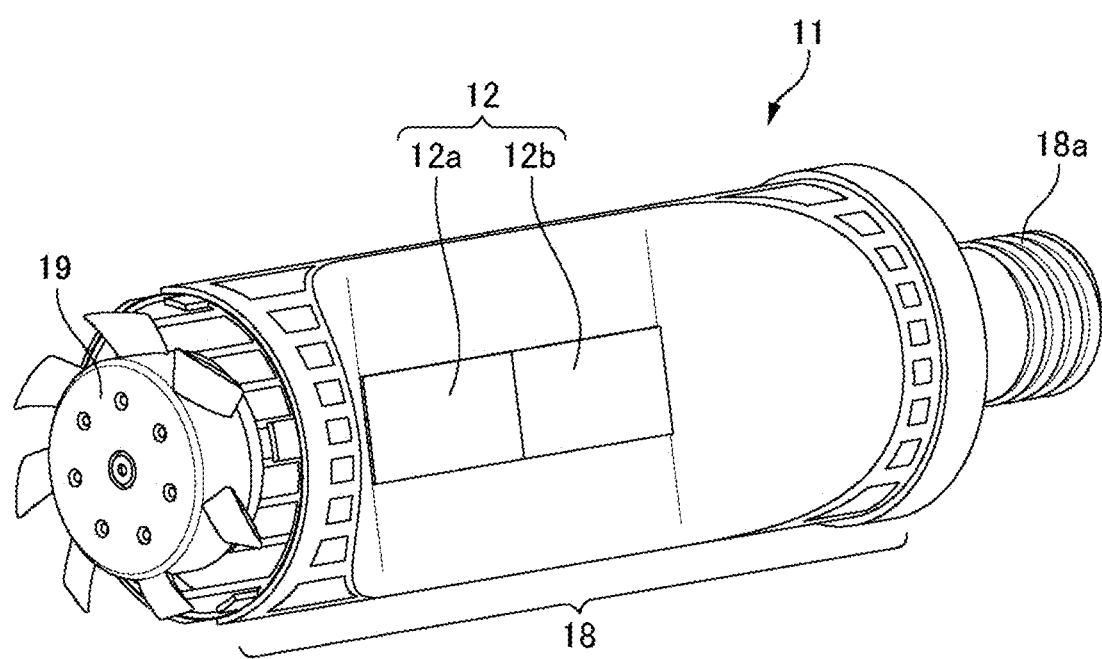

[FIG. 19]
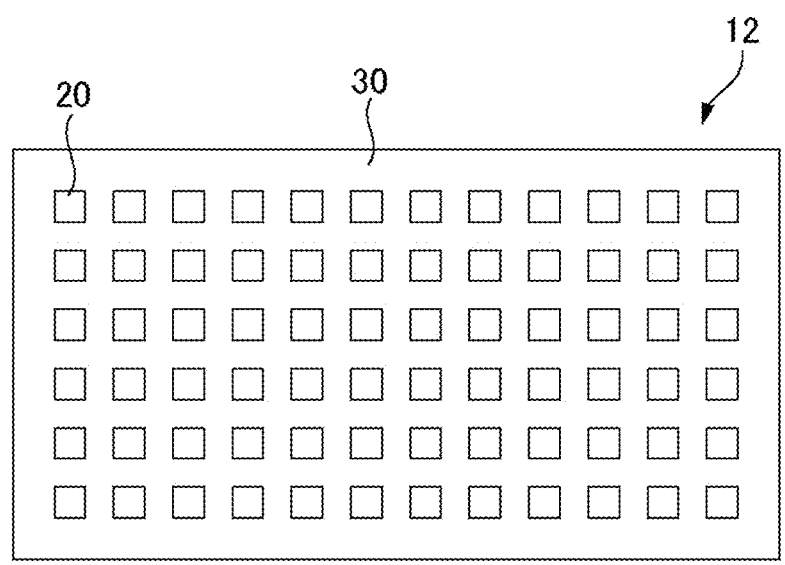

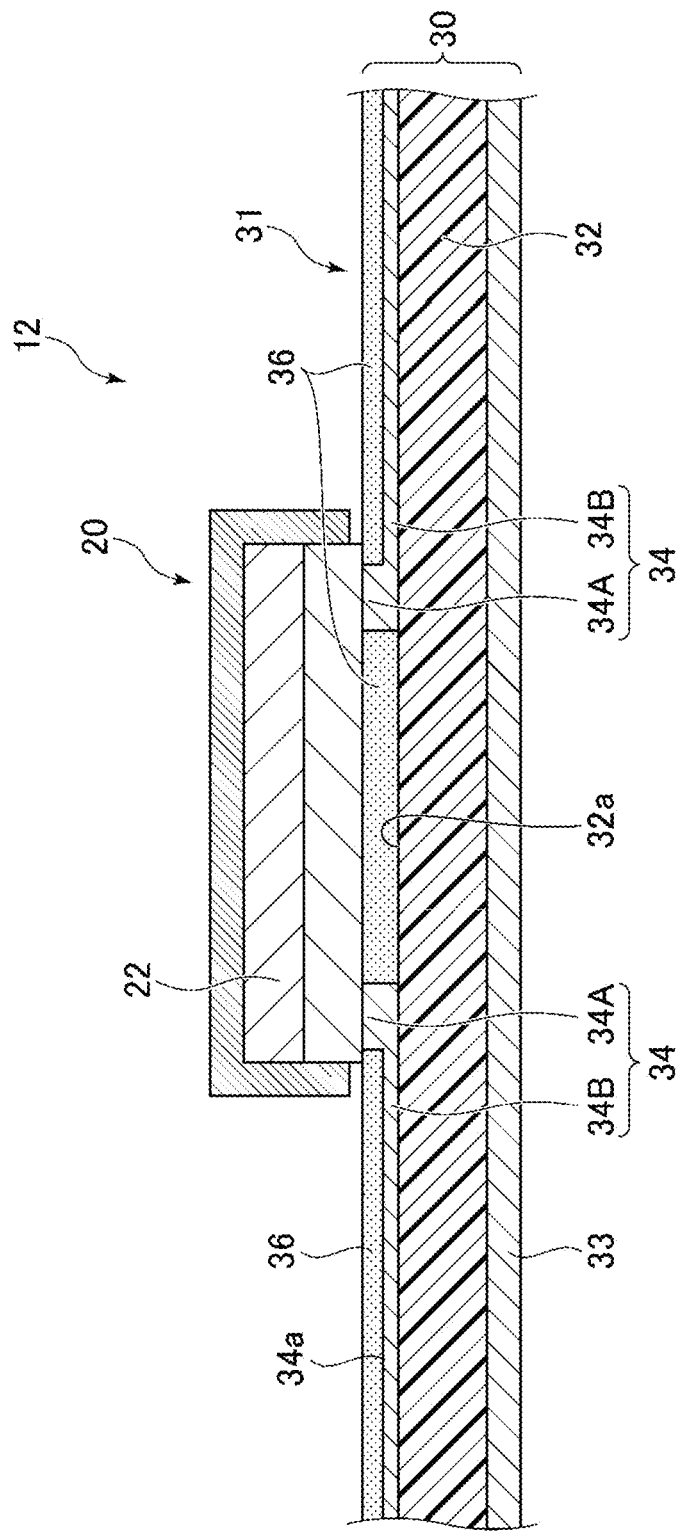
[FIG. 20]

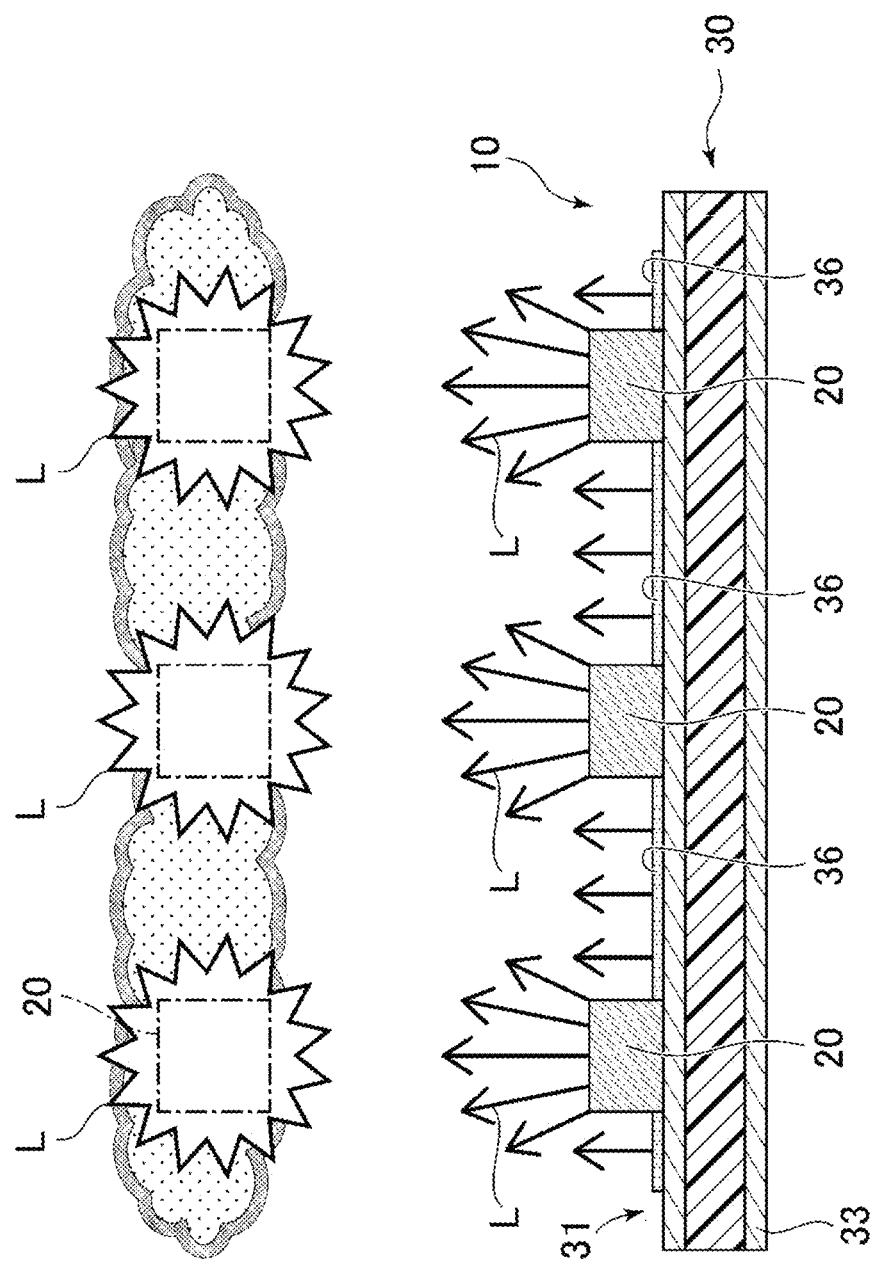
[FIG. 21]

[FIG. 22]
(a)
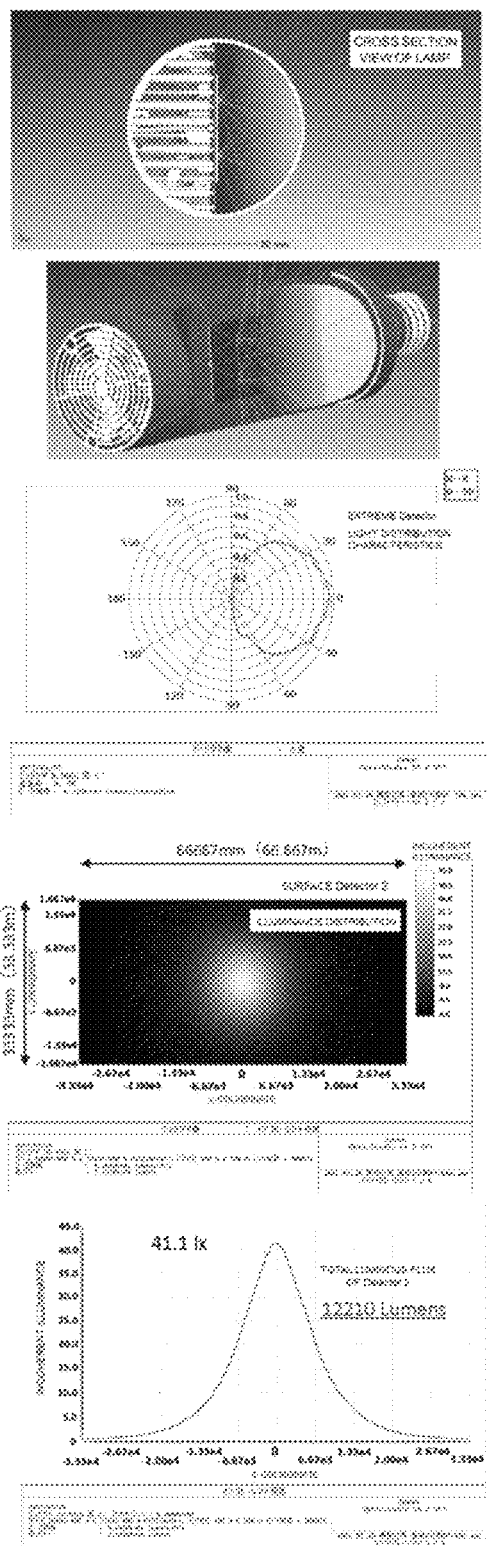

[FIG.22 continued]
(b)
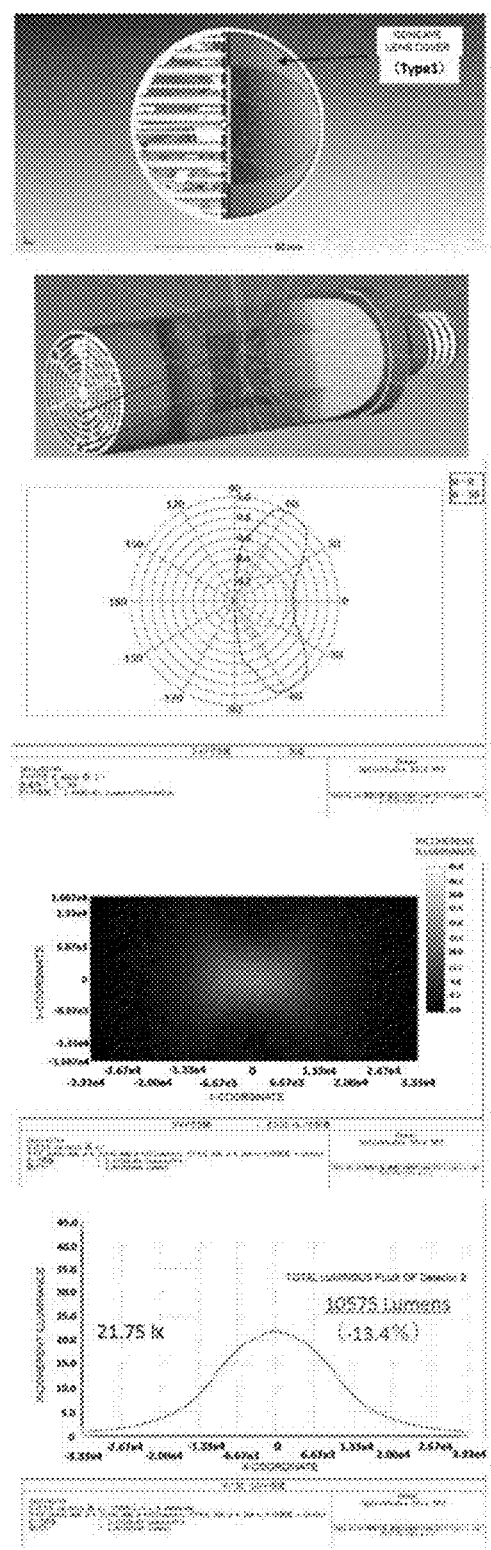

[FIG. 22 continued]
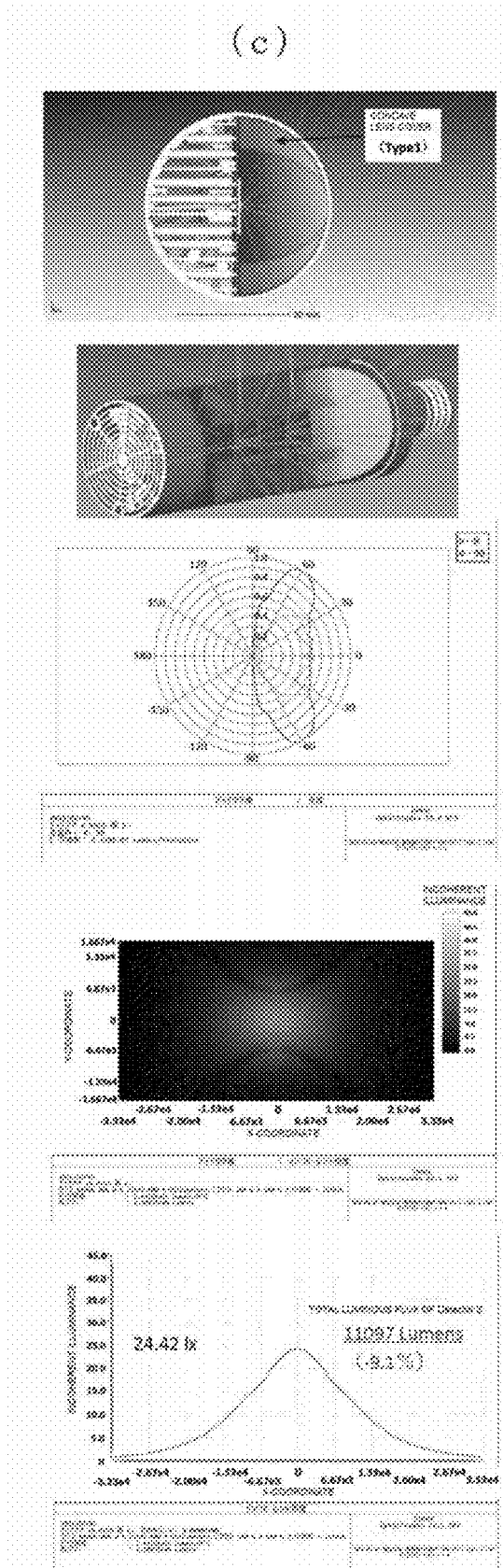

[FIG. 23]
(a) 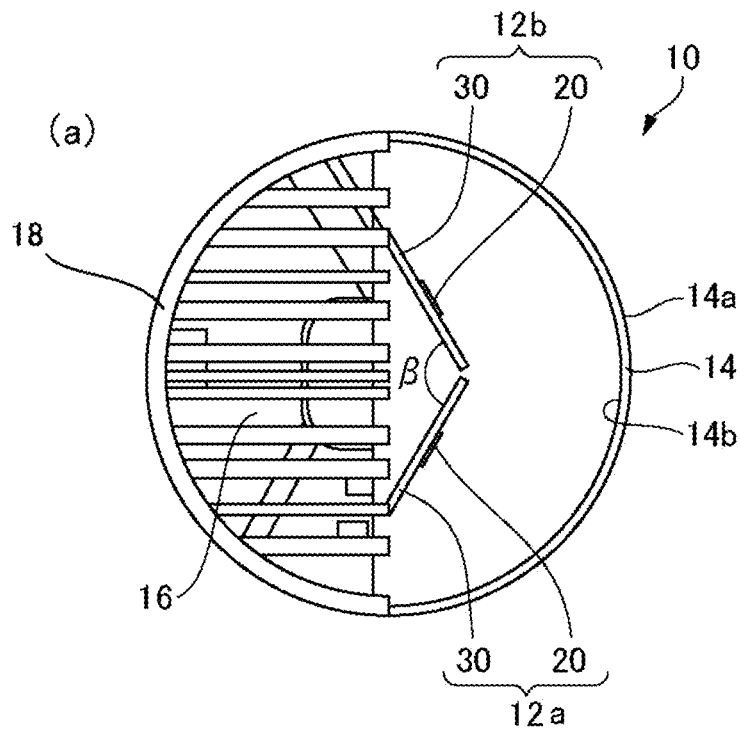
(b) 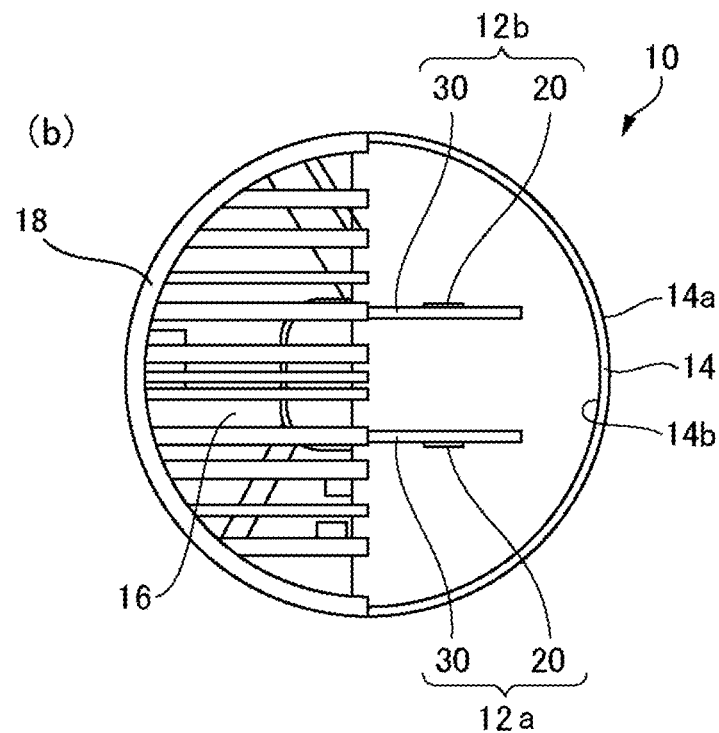

[FIG. 24]
(a)
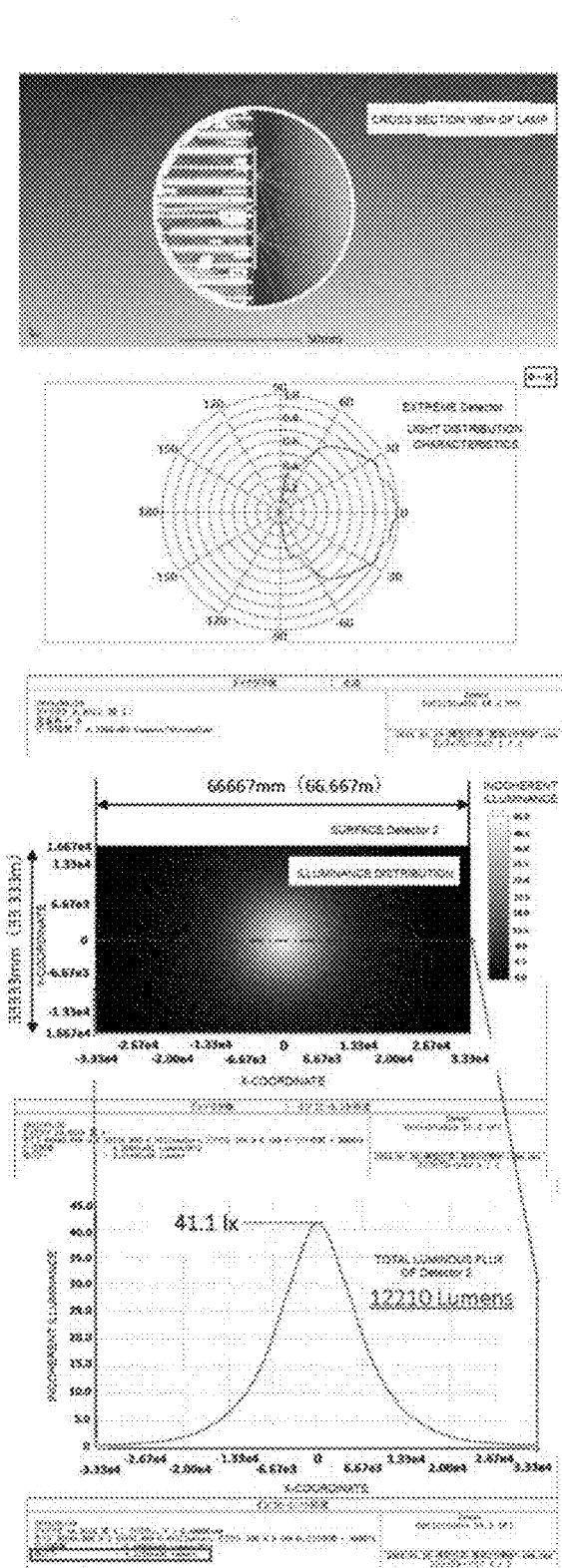

[FIG. 24 continued]
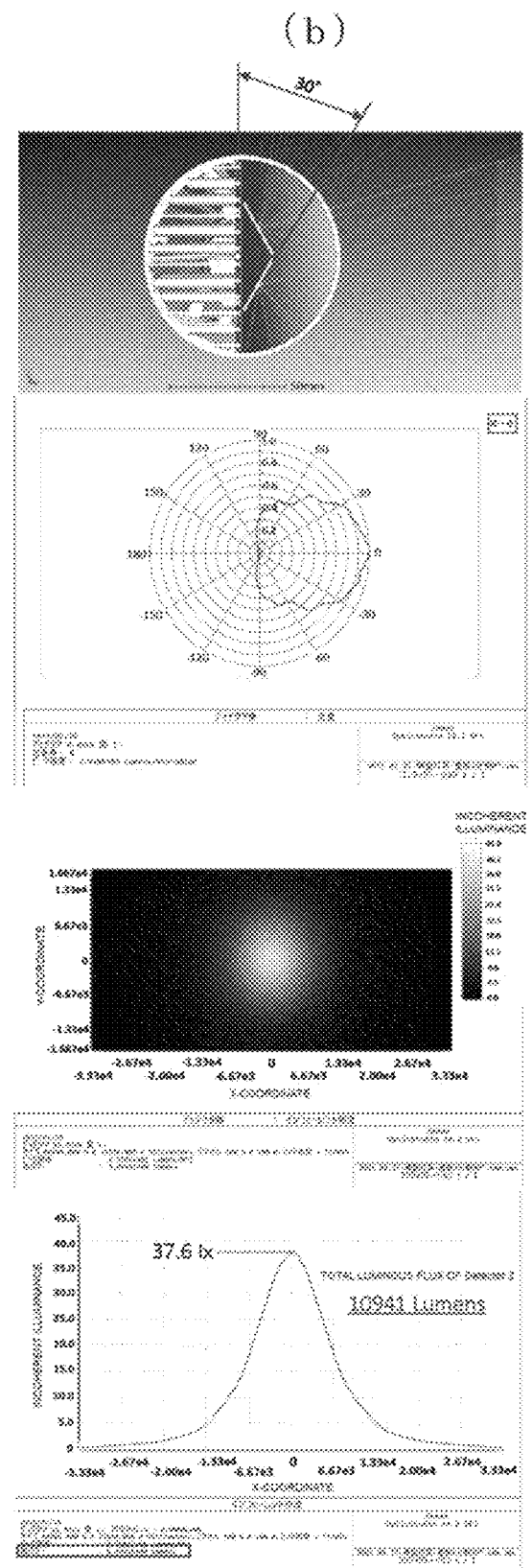

[FIG. 24 continued]
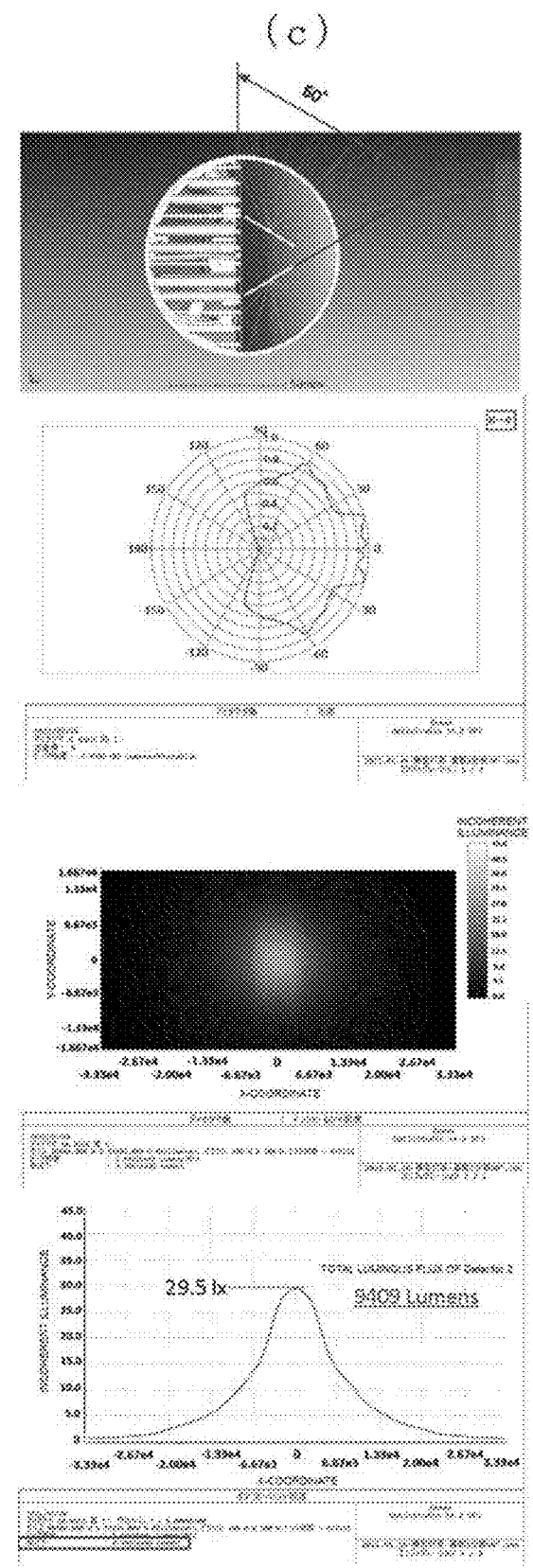

[FIG. 24 continued]
(d)
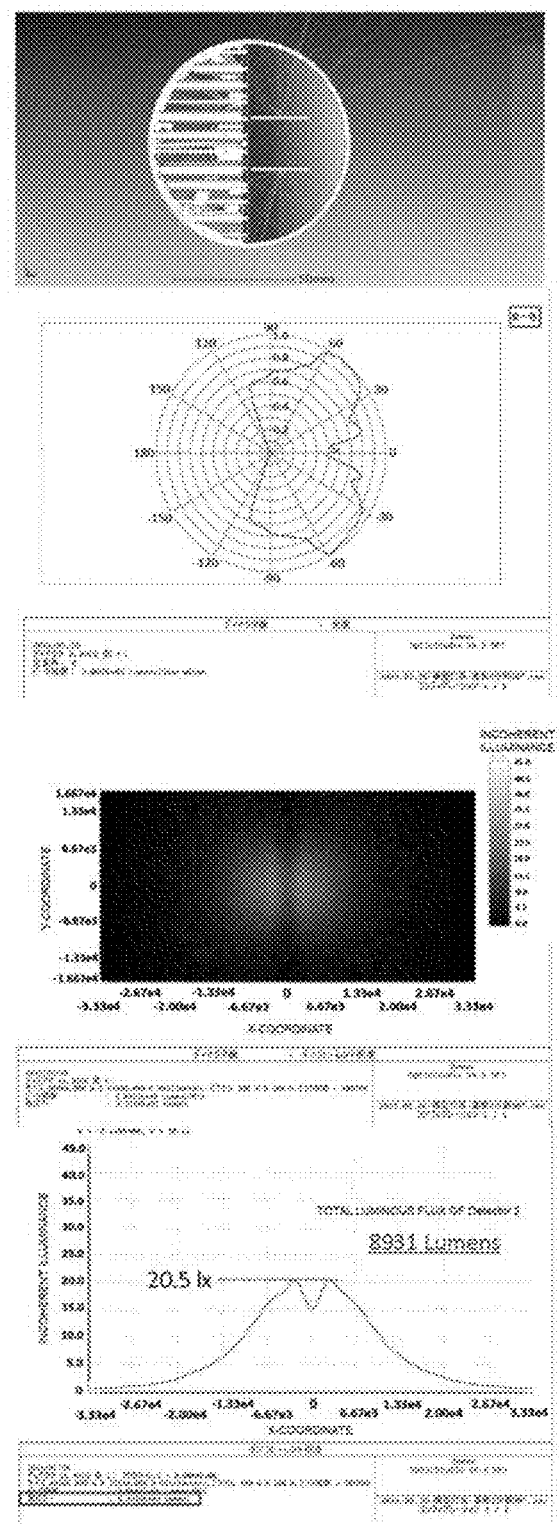

LIGHT SOURCE UNIT AND ROAD ILLUMINATION DEVICE EQUIPPED WITH LIGHT SOURCE UNIT

TECHNICAL FIELD

The present invention relates to a light source unit and a road illumination device equipped with the light source unit, which illuminate a peripheral region with illuminate light.

BACKGROUND ART

In road illumination devices in the related art, which illuminate a road surface such as a roadway and a sidewalk, as a light source, lamps such as a fluorescent lamp, a high-pressure mercury lamp, a metal halide lamp, and a sodium lamp have been widely used. There lamps can illuminate a wide illumination region such as a road with sufficient brightness by reflecting light from the lamp with a dome-shaped reflector. On the other hand, the light source consumes a large amount of power and has a relatively short life. In recent years, LEDs which consume less power and have a longer life have been used instead of these light sources (Patent Document 1).

As shown in FIG. 1, road illumination devices 100 are arranged at predetermined intervals along the road. From the viewpoint of safety, in order to evenly illuminate the road and further reduce the number of installed road illumination devices 100, it is preferable to widen an illumination range of illumination light as much as possible. For example, as shown in FIG. 1, by setting an illumination angle α to 60° to 65°, the illumination range can be a directly below region a and peripheral regions b.

As the related art to the road illumination device using LED lighting, Patent Document 2 discloses a road illumination device including a plurality of LED units each having LED and a reflecting surface.

RELATED DOCUMENT

Patent Document

[Patent Document 1] Japanese Unexamined Patent Publication No. 2009-99492
[Patent Document 2] Japanese Unexamined Patent Publication No. 2012-114001

SUMMARY OF THE INVENTION

Technical Problem

However, the related art disclosed in Patent Document 2 has the following problems.

In Patent Document 2, in order to achieve a desired light distribution, it is necessary to replace the entire road illumination device, and there is a problem of requiring cost and labor. In addition, there is a problem that most of light emitted from the LED unit does not contribute to road illumination, resulting in low illumination efficiency. Furthermore, in required years, standards required for road illumination have been higher, and light distribution characteristics capable of uniformly illuminating the entire road have been more strongly demanded.

Based on the above, an object of the present invention is to provide a light source unit which has high illumination efficiency and can illuminate the entire road in a uniform light distribution, and is to provide a road illumination device including the light source unit.

Solution to Problem

The present inventors have found that, in an LED unit attached to a road illumination device, the above-described problems can be solved by using a fluorescent printed wiring board on which a plurality of LED elements are mounted and by forming a light-transmissive cover covering the fluorescent printed wiring board into a predetermined shape, and have completed the present invention.

In addition, the present inventors have found that the above-described problems can be solved by providing a plurality of the fluorescent printed wiring boards and arranging these boards at a predetermined angle, and have completed the present invention.

That is, the present invention can be described as below.
[1] A light source unit including
 a light emitting module which has a printed wiring board and a plurality of light emitting diode elements mounted on the printed wiring board; and
 a light-transmissive light distribution adjustment portion which covers the light emitting module,
 in which the printed wiring board has a fluorescent layer containing fluorescent particles on a surface on which the light emitting diode elements are mounted, and
 the light distribution adjustment portion includes a portion having a convex shape outward from the board side, is spaced apart from the plurality of light emitting diode elements and from the fluorescent layer, commonly covers the plurality of light emitting diode elements and the fluorescent layer, and diffuses and distributes emission light from the light emitting diode elements and luminescence from the fluorescent layer.
[2] The light source unit according to [1],
 in which the light distribution adjustment portion emits the emission light from the light emitting diode elements and the luminescence from the fluorescent layer, and distributes the light in a batwing-type illuminance distribution.
[3] The light source unit according to [1] or [2],
 in which the light distribution adjustment portion includes a convex curved surface protruding outward from the board side.
[4] The light source unit according to [3],
 in which the light distribution adjustment portion has a bowl-like shape or a semi-cylindrical shape.
[5] The light source unit according to [3] or [4],
 in which the printed wiring board has a rectangular shape,
 an emission surface of the light distribution adjustment portion, which emits the emission light from the light emitting diode elements and the luminescence from the fluorescent layer, is a convex curved surface, and
 in a cross-sectional view along a plane orthogonal to a longitudinal direction of the board and a surface direction of the board and passing through a center portion of the board, in a case where a thickness of the light distribution adjustment portion in a normal direction of the convex curved surface is denoted as d, a thickness d at an end portion of the convex curved surface is larger than a thickness d at a top portion of the convex curved surface.
[6] The light source unit according to [5],
 in which a value of the thickness d gradually increases from the top portion of the convex curved surface to the end portion of the convex curved surface.

[7] The light source unit according to [1],
in which the light distribution adjustment portion includes a light receiving surface which receives the emission light from the light emitting diode elements and the luminescence from the fluorescent layer, and an emission surface which emits the received light, and
the emission surface of the light distribution adjustment portion includes irregularities composed of a mountain portion protruding toward outward and a valley portion adjacent to the mountain portion and recessed inward.

[8] The light source unit according to [1],
in which the light distribution adjustment portion includes a cylindrical lens portion.

[9] The light source unit according to [1],
in which the light distribution adjustment portion includes a Fresnel lens portion.

[10] The light source unit according to any one of [1] to [9],
in which the light emitting module includes a first light emitting module and a second light emitting module,
the first light emitting module and the second light emitting module do not exist over the same plane, and
an angle formed by a back surface of an element mounting surface of the board in the first light emitting module, on which the light emitting diode elements are mounted, and a back surface of an element mounting surface of the board in the second light emitting module, on which the light emitting diode elements are mounted, is equal to or more than 0° and equal to or less than 120°.

[11] A light source unit including
a light emitting module which has a printed wiring board and a plurality of light emitting diode elements mounted on the board; and
a light-transmissive light distribution adjustment portion which covers the light emitting module,
in which the printed wiring board has a fluorescent layer containing fluorescent particles on a surface on which the light emitting diode elements are mounted,
the light emitting module includes a first light emitting module and a second light emitting module,
the first light emitting module and the second light emitting module do not exist over the same plane, and
an angle formed by a back surface of a mounting surface of the light emitting diode elements in the first light emitting module and a back surface of a mounting surface of the light emitting diode elements in the second light emitting module is equal to or more than 0° and equal to or less than 120°.

[12] The light source unit according to any one of [1] to [11], further including:
a heat sink on a surface side of the board opposite to the surface on which the light emitting diode elements are mounted.

[13] The light source unit according to [12], further including:
a cooling fan.

[14] The light source unit according to any one of [1] to [13],
in which the fluorescent particles include one or two or more kinds selected from the group consisting of a CASN-based fluorescent substance, an SCASN-based fluorescent substance, a $La_3Si_6N_{11}$-based fluorescent substance, a $Sr_2Si_5N_8$-based fluorescent substance, a $Ba_2Si_5N_8$-based fluorescent substance, an α-sialon-based fluorescent substance, a β-sialon-based fluorescent substance, a LuAG-based fluorescent substance, and a YAG-based fluorescent substance.

[15] The light source unit according to any one of [1] to [14],
in which a median diameter $D_{50}$ of the fluorescent particles is equal to or more than 1 μm and equal to or less than 20 μm.

[16] The light source unit according to any one of [1] to [15],
in which a thickness of the fluorescent layer is equal to or less than 150 μm.

[17] The light source unit according to any one of [1] to [16],
in which the fluorescent layer contains a transparent resin which is transparent to visible light and the fluorescent particles dispersed in the transparent resin.

[18] The light source unit according to any one of [1] to [17],
in which the fluorescent layer is a cured product of a fluorescent coating material, and
the fluorescent coating material contains fluorescent particles and a curable resin component.

[19] The light source unit according to [18],
in which the curable resin component includes one or two or more kinds selected from the group consisting of a silicone resin and a (meth)acrylate monomer.

[20] The light source unit according to any one of [1] to [19],
in which the light source unit is used for road illumination.

[21] The light source unit according to any one of [1] to [20],
in which, in a case where a fluorescence peak wavelength of the fluorescent particles when luminescence of the light emitting diode elements is used as excitation light is denoted as λ1 and a luminescence wavelength of the light emitting diode elements is denoted as λ2, an absolute value Δλ of a difference between λ1 and λ2 is equal to or less than 50 nm.

[22] The light source unit according to any one of [1] to [21], further including:
a body including the light emitting module,
in which the light distribution adjustment portion is detachable from the body.

[23] The light source unit according to any one of [1] to [22], further including:
an attaching portion for detachably installing the light source unit to a housing of a road illumination device.

[24] A road illumination device including:
a housing; and
a light source unit housed in the housing,
in which the housing has a window portion for transmitting light emitted from the light source unit and a light source unit installing portion for installing the light source unit,
the light source unit is the light source unit according to [23], and
the light source unit is detachably installed to the light source unit installing portion.

The light source unit and the road illumination device according to the aspect of the present invention includes a printed wiring board including a fluorescent layer, and a light distribution adjustment portion having a specific shape and having characteristics of diffusing and distributing emission light from the light emitting diode elements and luminescence from the fluorescent layer. The fluorescent layer absorbs light emitted from the light emitting diode elements backward in a direction opposite to an illuminate direction, and emits fluorescence using the light as excitation light. The emission light flux composed of the fluorescence and the emission light from the light emitting diode elements includes components in various directions, and it is difficult to achieve high illumination efficiency as it is. Therefore, in the present invention, the fluorescence and the emission light from the light emitting diode elements are configured to be emitted to the outside through the light distribution adjustment portion having the above-described shape and the above-described characteristics. As described above, according to the present invention, by a synergistic effect of the fluorescent printed wiring board and the light-transmissive light distribution adjustment portion covering the light emitting module, it is possible to achieve high illumination efficiency and light distribution characteristics which uniformly illuminate the entire road.

Advantageous Effects of Invention

According to the present invention, it is possible to provide a light source unit which can illuminate with high illumination efficiency and a desired light distribution, and it is possible to provide a road illumination device including the light source unit.

BRIEF DESCRIPTION OF THE DRAWINGS

FIG. 1 is a side view showing a situation in which the road illumination devices according to the present embodiment are arranged.

FIG. 2 is a top view showing a situation in which the road illumination devices according to the present embodiment are arranged.

FIG. 3 is a bottom view of the road illumination device according to the present embodiment as viewed from below.

FIG. 4 is a cross-sectional view of the road illumination device in FIG. 3 taken along a line A-A'.

FIG. 5 is a plan view of the road illumination device according to the present embodiment as viewed from above.

FIG. 6 is a side view of the road illumination device according to the present embodiment.

FIG. 7 is a perspective view of the light source unit according to the present embodiment.

FIG. 8 is a perspective view showing a form of the light source unit according to the present embodiment, from which a light distribution adjustment portion is detached.

FIG. 9 is a graph showing a batwing-type illuminance distribution.

FIG. 10(a) is a perspective view of a semi-cylindrical light distribution adjustment portion (cylindrical lens), and FIG. 10(b) is a cross-sectional view thereof taken along a line B-B'.

FIG. 11(a) is a top view of the semi-cylindrical light distribution adjustment portion (cylindrical lens), and FIG. 11(b) is a side view thereof.

FIG. 12(a) is a perspective view of a bowl-like light distribution adjustment portion, and FIG. 12(b) is a cross-sectional view thereof taken along a line C-C'.

FIG. 13 is a cross-sectional view of another form of the light distribution adjustment portion.

FIG. 14 is a cross-sectional view of another form of the light distribution adjustment portion (Fresnel lens).

FIG. 15 is a perspective view of a semi-cylindrical light distribution adjustment portion (Fresnel lens).

FIG. 16 is a perspective view of another form of the semi-cylindrical light distribution adjustment portion (Fresnel lens).

FIG. 17 is a perspective view showing a positional relationship of a light emitting module in a first embodiment.

FIG. 18 is a perspective view showing a positional relationship of the light emitting module in the first embodiment.

FIG. 19 is a top view of the light emitting module in the first embodiment.

FIG. 20 is a partial cross-sectional view of a light emitting printed wiring board which is one form of the light emitting module in the first embodiment.

FIG. 21 is a diagram for explaining a light emitting operation of the light emitting printed wiring board in the first embodiment.

FIG. 22 is a diagram for explaining an effect of the light emitting module in the first embodiment.

FIG. 23(a) is a cross-sectional view showing an angle of two light emitting modules in a light source unit according to a second embodiment, and FIG. 23(b) is a cross-sectional view showing a state in which the two light emitting modules are arranged at an angle of 0°.

FIG. 24 is a diagram for explaining an effect of the light emitting module in the second embodiment.

DESCRIPTION OF EMBODIMENTS

Hereinafter, embodiments of the present invention will be described with reference to the drawings. In all drawings, the same components are designated by the same reference numerals, and description thereof will not be repeated.

First Embodiment

A preferred embodiment of the road illumination device according to the present embodiment will be described with reference to the drawings.

A situation in which the road illumination devices 100 are arranged is shown in FIGS. 1 and 2. FIG. 1 shows a side view of a road lamp, and FIG. 2 shows a top view thereof. As shown in FIG. 1, each road illumination device 100 is supported by a pillar P. As already described with reference to FIG. 1, the illumination angle α is set to 60° to 65°, and the illumination range includes a lower region a and peripheral regions b of the road illumination device 100.

FIG. 3 is a bottom view of the road illumination device 100 as viewed from below. FIG. 4 is a cross-sectional view of FIG. 3 taken along the line A-A'. FIG. 5 is a plan view of the road illumination device 100 as viewed from above. FIG. 6 is a side view of the road illumination device 100.

As shown in FIG. 3, the road illumination device 100 includes a housing and a light source unit 10 housed in the housing.

As shown in FIGS. 3, 5, and 6, the housing consists of a lower body case 101 and an upper body case 102. By combining these, as shown in FIG. 4, a space a for accommodating the light source unit 10 is formed inside. As shown in FIG. 6, the upper body case 102 further includes a first case portion 102a located on a front side and a second case portion 102b located on a rear side. In FIG. 3, the left side faces the road side, and a pillar coupling portion 103 is provided on the right side.

A screw hole (light source unit installing portion) (not shown) is provided on a side of the pillar coupling portion 103 inside the lower body case 101, and the light source unit 10 is detachably installed to the lower body case 101 by screwing a screw portion 18a of the light source unit 10, which is shown in FIG. 7 and the like, into the screw hole. As shown in FIGS. 3 and 4, a lower surface 101b of the lower body case 101 is provided with a window portion 104 so that light from the light source unit 10 can illuminate a road surface. The window portion 104 can be made of glass or resin. A large number of grooves 101a for heat dissipation are formed in a side surface of the lower body case 101.

[Light Source Unit]

As shown in FIGS. 7 and 8, the light source unit 10 according to the present embodiment includes a light emitting module 12, a substantially cylindrical body 11 including the light emitting module 12, and a light distribution adjustment portion 14 detachably provided on the body 11. The body 11 includes a body portion 18 and a cooling fan 19 provided at one end portion of the body portion 18. In order to secure the amount of air (flow of air) from the cooling fan 19, the cooling fan 19 is usually covered with a cover (not shown).

As shown in FIG. 8, the body portion 18 has a substantially cylindrical shape and has a radially inwardly recessed portion in a longitudinal center portion. A bottom surface of the recessed portion forms a flat surface, and the light emitting module 12 is mounted (fixed) on this bottom surface.

The body portion 18 has an interior space, and as shown in FIG. 23, has a heat sink 16 in the interior space. The heat sink 16 includes a plurality of fins, and is in contact with a fluorescent printed wiring board of the light emitting module 12. In addition, the interior space is provided with a power supply drive circuit or a temperature sensor, and the drive circuit controls driving of the cooling fan 19 so that the inside of the light source unit 10 can be controlled within a desired temperature range.

The drive circuit includes an LED driver IC, a capacitor, and the like, and controls current flowing through an LED chip to a desired value by pulse width modulation (PWM) control of the on-duty (off-duty) of the drive element Q by switching operation.

As shown in FIGS. 7 and 8, the light distribution adjustment portion 14 is detachably attached to the body 11 (body portion 18), and can be replaced to obtain a desired light distribution. Therefore, replacement of parts of the body 11 including the light emitting module 12 and replacement of the light distribution adjustment portion 14 are facilitated. In addition, a set consisting of the body 11 including one type of the light emitting module 12 and a plurality of types of light distribution adjustment portions 14 having different light distribution characteristics is formed to achieve desired light distribution characteristics by selecting an appropriate light distribution adjustment portion 14 according to the application location.

The light source unit 10 according to the present embodiment can be distributed as a light source unit set including the body 11 including the light emitting module 12 and a plurality of types of light distribution adjustment portions 14 having different light distribution characteristics. According to an environment in which the road illumination device 100 is provided, one type of light distribution adjustment portion 14 is selected from the light source unit set, the selected light distribution adjustment portion 14 is attached to the body 11 including the light emitting module 12 to form the light source unit 10, and the light source unit 10 can be installed as a light source of the road illumination device 100. As a result, it is also possible to achieve desired light distribution characteristics according to the environment in which the road illumination device 100 is provided.

Various aspects are conceivable as specific methods for configuring the light distribution adjustment portion 14 to be detachable from the body 11 of the light source unit 10. In the present embodiment, the light distribution adjustment portion 14 is provided with a claw portion (not shown), and the body portion 18 of the light source unit 10 is provided with an engaging portion (not shown) consisting of a notch portion, a concave portion, or a projection portion, and the claw portion is configured to engage with the engaging portion.

The body portion 18 can be made of resin or metal.

The body portion 18 includes the screw portion (attaching portion) 18a at one end portion. The screw portion 18a is formed of, for example, die-cast aluminum.

Inside the lower body case 101, a screw hole is provided on the side of the pillar coupling portion 103, and by screwing the screw portion 18a into the screw hole, the light source unit 10 can be detachably installed to the lower body case 101. In addition, the light emitting module 12 is electrically connected through the screwed screw portion 18a.

In the related art of Patent Document 2 and the like, in order to achieve a desired light distribution, it is necessary to replace the entire road illumination device, and there is a problem of requiring cost and labor. According to the light source unit 10 of the present embodiment, a desired light distribution can be achieved simply by replacing the light source (more specifically, the light distribution adjustment portion 14) used in the existing road illumination device, and cost and labor can be reduced.

Although the heat dissipation fin has been exemplified as the heat dissipation means, there are other heat dissipation openings and heat dissipation slits. An optimum heat dissipation means is appropriately used based on the required heat dissipation performance, noise performance, and the like.

[Light Distribution Adjustment Portion]

As shown in FIG. 8, the light distribution adjustment portion 14 is installed to cover the light emitting module 12, and has a convex shape outward from the light emitting module 12 side. That is, an outer surface of the light distribution adjustment portion 14 has a shape which protrudes outward from the light emitting module 12 side. Although a relationship between the outer surface of the light distribution adjustment portion 14 and an inner surface of the light distribution adjustment portion 14 is arbitrary, as shown in FIGS. 10 to 14 described later, a so-called concave lens shape (for example, a concave meniscus lens shape with a concave lens shape on the inner surface, a convex lens shape on the outer surface, and a thicker edge) is preferable. By doing so, emission light from the light emitting module 12 can be diffused and emitted (illuminated) to the outside.

Examples of a shape of the light distribution adjustment portion 14 include curved shapes such as a dome shape, a cylindrical shape, and a Fresnel lens shape.

The light distribution adjustment portion 14 receives the emission light from the light emitting module 12, and the like, and emits the received light to the outside. Examples of the light distribution adjustment portion 14 include a transparent cover and a transparent lens. The light distribution adjustment portion 14 according to the present embodiment is spaced apart from a plurality of light emitting diode elements and from the fluorescent layer, and has a structure that covers the entire light emitting module 12 (that is, commonly covers the plurality of light emitting diode elements and the fluorescent layer), which is different from an optical system structure that is provided to cover each light emitting diode element with resin or the like.

The light distribution adjustment portion 14 can be made of a material transparent to an emission wavelength of the light emitting diode element (LED or the like). Examples of the transparent material include a thermoplastic resin, a thermosetting resin, and glass, and the transparent material preferably has high heat resistance so that it can withstand the temperature rise inside the light source unit 10 due to heat generated by the light emitting diode element.

In addition, from the viewpoint of molding processability, a thermoplastic resin or a thermosetting resin is preferable, and examples thereof include polyimide, polyacrylate, polysulfone, polyallylsulfone, aromatic polyamide, aromatic polyetheramide, polyphenylene sulfide, polyaryletherketone, polyamideimide, liquid crystalline polyester, and polytetrafluoroethylene. The light distribution adjustment portion 14 can contain a diffusing agent, an ultraviolet absorber, an antioxidant, and the like.

In a case where the light distribution adjustment portion 14 is made of resin, it can be manufactured by injection molding, compression molding, transfer molding, casting molding, or the like.

In the present embodiment, a coat layer can be provided on a surface of an emission surface of the light distribution adjustment portion 14. Examples of the coat layer include a hard coat layer, an antireflection layer, and an antifouling layer, and the coat layer can be a single layer or a laminate of two or more layers.

The light distribution adjustment portion 14 emits the emission light from the light emitting diode element and the luminescence from the fluorescent layer, and as shown in FIG. 9, distributes the light in a batwing-type illuminance distribution.

With the batwing-type illuminance distribution, by suppressing the amount of light emitted directly below the road illumination device 100 and increasing the amount of light emitted in an oblique direction, it is possible to widen the light distribution and suppress luminance unevenness on the surface to be illuminated (that is, the road).

As shown in FIG. 9, the batwing light distribution characteristics are defined as having a luminescence intensity distribution in which, in a case where an optical axis L is defined as 0°, a luminescence intensity at an angle where an absolute value of light distribution angle is larger than 0° is higher than a luminescence intensity at 0°. The optical axis L is defined by a line passing through a center of the light emitting module 12 and orthogonal to a plane of the board described later.

The shape of the light distribution adjustment portion 14 is not particularly limited as long as it can distribute light in the batwing-type illuminance distribution, and the shape can include a convex curved surface protruding outward from the light emitting module 12 side. Examples thereof include a semi-cylindrical shape as shown in FIG. 10 and a bowl-like shape as shown in FIG. 12.

FIG. 10(a) shows a perspective view of the light distribution adjustment portion 14, FIG. 10(b) shows a cross-sectional view of FIG. 10(a) taken along the line B-B', FIG. 11(a) shows a top view thereof, and FIG. 11(b) shows a side view thereof.

As shown in FIG. 10, the light distribution adjustment portion 14 includes a light receiving surface 14a which receives the emission light from the light emitting diode element and the luminescence from the fluorescent layer, and an emission surface 14b which emits the received light. The light distribution adjustment portion 14 is open on a lower side of the drawings (that is, on the side of the light emitting module 12). The light distribution adjustment portion 14 is attached to the heat sink 16 through the open end portion to cover the light emitting module 12. A radius of curvature of the emission surface 14b can be approximately 42 mm.

The emission surface 14b is a convex curved surface protruding from the light emitting module 12 side toward the road surface to be illuminated, and is configured to diffuse and distribute the emission light from the light emitting diode element and the luminescence from the fluorescent layer.

As an example of the light distribution adjustment portion 14, as shown in the top view of the light distribution adjustment portion 14 in FIG. 11(a), a longitudinal length 14a can be approximately 192 mm, a longitudinal length 14b can be approximately 100 mm, a longitudinal length 14c can be approximately 46 mm, a lateral length 14d can be approximately 85 mm, a lateral length 14e can be approximately 50 mm, and a lateral length 14f (width of an end portion a) can be approximately 17.5 mm.

As an example of the light distribution adjustment portion 14, as shown in the side view of the light distribution adjustment portion 14 in FIG. 11(b), a height 14g can be approximately 21 mm.

In addition, the light distribution adjustment portion 14 may have a bowl-like shape as shown in FIG. 12(a). As shown in FIG. 12(b) which is the cross-sectional view of FIG. 12(a) taken along the line C-C', the light distribution adjustment portion 14 includes a light receiving surface 14a which receives the emission light from the light emitting diode element and the luminescence from the fluorescent layer, and an emission surface 14b which emits the received light.

In a case where the light distribution adjustment portion 14 of FIG. 10 or FIG. 12 covers the light source unit 10 including a rectangular printed wiring board, in a cross-sectional view along a plane orthogonal to a longitudinal direction of the board and a surface direction of the board and passing through a center portion of the board (that is, in FIG. 10(b) or FIG. 12(b)), it is preferable that, in a case where a thickness of the light distribution adjustment portion 14 in a normal direction of the emission surface 14b (convex curved surface) is denoted as d, a thickness d1 at an end portion a of the emission surface 14b is larger than a thickness d2 at a top portion b of the emission surface 14b, and a value of the thickness d gradually increases from the top portion b of the emission surface 14b to the end portion a of the emission surface 14b.

From the viewpoint of achieving favorable light distribution characteristics, a lower limit value of a ratio (d1/d2) of the thickness d1 at the end portion a to the thickness d2 at the top portion b can be equal to or more than 6, preferably equal to or more than 8, and an upper limit value thereof can be equal to or less than 10, preferably equal to or less than 16.

From the viewpoint of achieving favorable light distribution characteristics, a lower limit value of the thickness d1 at the end portion a can be equal to or more than 8 mm, preferably equal to or more than 10 mm, and an upper limit value thereof can be equal to or less than 30 mm, preferably equal to or less than 25 mm.

From the viewpoint of achieving favorable light distribution characteristics, a lower limit value of the thickness d2 at the top portion b can be equal to or more than 0.5 mm, preferably equal to or more than 1 mm, and an upper limit value thereof can be equal to or less than 5 mm, preferably equal to or less than 3 mm.

In the light source unit 10 according to the present embodiment, by appropriately selecting the material of the light distribution adjustment portion 14 and further adjusting the overall shape including the thickness of each portion and their ratio, it is possible to emit the emission light from the light emitting diode element and the luminescence from the above-described fluorescent layer, and as shown in FIG. 9, it is possible distribute the light in the batwing-type illuminance distribution.

In a case where the road illumination device 100 according to the present embodiment is used for road illumination for vehicles, from the viewpoint of suppressing diffusion of light to the vehicle side, as shown in FIG. 10, the light distribution adjustment portion 14 may include a cylindrical lens portion at the end portion a (end portion connected to the body 11) in the lateral direction. The cylindrical lens portion may be entirely made of resin or the like, or may be hollow inside.

In the present embodiment, the longitudinal direction means an axial direction of the substantially cylindrical body 11, and the lateral direction means a direction orthogonal to the longitudinal direction.

The cylindrical lens is a lens formed by splitting a cylinder in the axial direction, in which one surface has curvature and the other surface has no curvature.

In addition, as shown in the cross-sectional view of FIG. 13, the emission surface 14b of the light distribution adjustment portion 14 with reference to FIGS. 10 and 11 can have a configuration including irregularities composed of a mountain portion 14b-1 which protrudes outward and extends along the longitudinal direction or a circumferential direction of the emission surface 14b, and a valley portion 14b-2 which is provided adjacent to the mountain portion 14b-1, is recessed inward, and extends along the longitudinal direction or the circumferential direction of the emission surface 14b.

In addition, as shown in the cross-sectional view of FIG. 14, the end portion (end portion connected to the body 11) in the lateral direction may include a Fresnel lens portion.

The Fresnel lens is a lens in which a lens surface (cylindrical lens portion at edge) is processed to reduce a thickness concentrically, and has a structure in which chevron-shaped prisms are formed in steps. In addition, the chevron-shaped prisms can change a traveling direction of light.

An example of the light distribution adjustment portion 14 including the Fresnel lens portion is shown as the perspective view of FIG. 15 or FIG. 16. The light distribution adjustment portion 14 shown in FIG. 15 includes a Fresnel lens portion in place of the cylindrical lens portion shown in FIG. 10. A cross-sectional view of the light distribution adjustment portion 14 shown in FIG. 15 taken along the line B-B' is the same as the cross-sectional view of FIG. 14. The light distribution adjustment portion 14 shown in FIG. 16 includes the Fresnel lens portion over the entire longitudinal direction.

[Light Emitting Module]

As shown in FIG. 8, the light source unit 10 according to the present embodiment includes a rectangular light emitting module 12. The shape of the light emitting module 12 is not particularly limited, and various shapes can be adopted.

In addition, in the present embodiment, a plurality of light emitting modules 10 can be provided, and by changing installation positions of the plurality of light emitting modules 10, the badwing light distribution can be achieved more favorably.

For example, as shown in FIG. 17, the light emitting module 12 may be composed of a first light emitting module 12a and a second light emitting module 12b, and the first light emitting module 12a and the second light emitting module 12b may be arranged along the lateral direction of the light source unit 10, or may be arranged along the longitudinal direction as shown in FIG. 18.

From the viewpoint of distributing light over a wide area and achieving badwing light distribution, it is preferable that, as shown in FIG. 18, the first light emitting module 12a and the second light emitting module 12b are arranged along the longitudinal direction of the board.

[Configuration of Light Emitting Module]

As shown in FIG. 19, the light emitting module 12 has a fluorescent printed wiring board 30 and a plurality of light emitting diode elements (LED chips) 20 mounted on the fluorescent printed wiring board 30. The fluorescent printed wiring board 30 has a printed wiring board and a fluorescent layer containing fluorescent particles on a surface of the board, on which the light emitting diode elements 20 are mounted.

The board constituting the fluorescent board is an insulating printed wiring board, and has a rectangular shape as viewed from above. The plurality of LED chips are arranged in a grid pattern on the rectangular board.

A specific structure of the light emitting diode element 20 will be described with reference to FIGS. 20 and 21. FIG. 20 is a partial cross-sectional view of the light emitting module 12, showing the specific structure of the light emitting diode element 20.

<Light Emitting Diode Element>

As shown in FIG. 20, each light emitting diode element 20 is formed as a Chip Scale Package (CSP) in which a flip chip LED 22 (hereinafter, simply referred to as "LED 22") is incorporated. One or a plurality of light emitting diode elements 20 are arranged on a front surface 31 (an example of one surface) of the fluorescent printed wiring board 30. A correlated color temperature of light emitted by the light emitting diode elements 20 is, for example, 3,018 K.

In addition, during light emitting operation, for example, by using the heat sink 16 with the cooling fan 19 described above, the light emitting diode element 20 dissipates heat (cools) such that, as an example, the temperature of the fluorescent printed wiring board 30 stays within a range from normal temperature to 50° C. to 100° C.

Here, to further explain the meaning of "to" used for numerical ranges in the present specification, for example, "50° C. to 100° C." means "equal to or higher than 50° C. and equal to or lower than 100° C.". In addition, "to" used in the numerical range in the present specification means "equal to or more than the description part before "to" and equal to or less than the description part after "to"".

<Arrangement of Light Emitting Diode Elements>

It is preferable that a plurality of light emitting diode elements 20 are provided on the fluorescent printed wiring board 30. It is preferable that the light emitting diode elements 20 are arranged in an array or matrix on the fluorescent printed wiring board 30.

Examples of the array include a linear shape and a zigzag shape. Examples of the matrix include a grid pattern arrangement as shown in FIG. 19, a square lattice, a houndstooth lattice, and an orthorhombic lattice.

In the present embodiment, from the viewpoint of obtaining uniformly emitted light from the light emitting module 12, it is preferable that the light emitting diode elements 20 are arranged in a grid pattern as shown in FIG. 19.

<Fluorescent Printed Wiring Board>

As shown in FIG. 20, the fluorescent printed wiring board 30 according to the embodiment includes an insulating layer 32 (an example of the insulating board), and an electrode layer 34 and a fluorescent layer 36 provided on a front surface of the insulating layer 32. A back surface pattern layer (not shown) may be provided on a surface opposite to the above-described front surface in the fluorescent printed wiring board 30. As an example, the fluorescent layers 36 are arranged on a front surface 32a of the insulating layer 32 and a front surface 34a of the electrode layer 34, and are arranged on portions other than surfaces of a plurality of electrode pairs 34A, which will be described later.

The fluorescent printed wiring board 30 according to the present embodiment is manufactured by processing (etching or the like) a double-sided board (hereinafter, referred to as "motherboard MB") having copper foil layers on both sides of an insulating plate, and CS-3305A manufactured by Risho Kogyo Co., Ltd. is used as an example of the motherboard MB.

<Insulating Layer>

Hereinafter, main features of the insulating layer 32 according to the present embodiment will be described.

As described above, the shape thereof is, for example, rectangular as viewed from the front surface 31 side and the back surface 33 side.

A material thereof is, for example, an insulating material including bismaleimide resin and glass cloth.

A thickness thereof is, for example, 100 μm to 200 μm.

Coefficients of thermal expansion (CTE) in the longitudinal direction and the lateral direction are each, for example, equal to or less than 10 ppm/° C. in a range of 50° C. to 100° C. In addition, from another viewpoint, the coefficients of thermal expansion (CTE) in the longitudinal direction and the lateral direction are each, for example, 6 ppm/° C. This value is almost equivalent (90% to 110%, that is, within ±10%) to that in the case of the light emitting diode element 20 according to the present embodiment.

A glass transition temperature thereof is, for example, higher than 300° C.

A storage modulus thereof is, for example, more than $1.0\times10^{10}$ Pa and less than $1.0\times10^{11}$ Pa in a range of 100° C. to 300° C.

<Electrode Layer>

The electrode layer 34 according to the present embodiment is a metal layer provided on the front surface 31 side of the insulating layer 32. The electrode layer 34 according to the present embodiment is, for example, a copper foil layer (layer made of Cu). In other words, at least surface of the electrode layer 34 contains copper.

The electrode layer 34 has a pattern provided on the insulating layer 32, and is electrically connected to a terminal (not shown) to which a connector (not shown) is bonded. The electrode layer 34 supplies power supplied from an external power supply (for example, a drive circuit) by direct connection of lead wires or through the connector to the light emitting diode element 20 in the configuration of the light emitting module 12. In a case where there are a plurality of light emitting diode elements 20, a part of the electrode layer 34 is a plurality of electrode pairs 34A to which the plurality of light emitting diode elements 20 are bonded respectively. As illustrated, as an example, the plurality of electrode pairs 34A protrude outward from a wiring portion 34B in a thickness direction of the insulating layer 32 (fluorescent printed wiring board 30).

A region where the electrode layers 34 are arranged on the front surface 32a of the insulating layer 32 (area occupied by the electrode layers 34) is, for example, equal to or more than 60% of a region of the front surface 31 of the insulating layer 32.

From the viewpoint of power supply to the light emitting diode element 20, it is preferable that the fluorescent printed wiring board 30 according to the present embodiment includes the electrode layer 34.

<Fluorescent Layer>

As an example, the fluorescent layers 36 according to the present embodiment are arranged on a front surface 32a of the insulating layer 32 and a front surface 34a of the electrode layer 34, and are arranged on portions other than surfaces of the plurality of electrode pairs 34A. In the present embodiment, a region where the fluorescent layers 36 are arranged on the front surface 31 of the insulating layer 32 is, for example, equal to or more than 80% of the region of the front surface 31 of the insulating layer 32.

As an example, the fluorescent layer 36 according to the present embodiment is an insulating layer containing a fluorescent substance and an organic binder resin described later. The fluorescent substance contained in the fluorescent layer 36 is fine particles held in a dispersed state in the organic binder resin, and has a property of being excited as excitation light using the luminescence of each light emitting diode element 20. Specifically, the fluorescent substance according to the present embodiment has a property in which a luminescence peak wavelength is in a visible light region in a case where the luminescence of the light emitting diode element 20 is used as excitation light.

The fluorescent layer 36 can be obtained by curing a fluorescent coating material.

<Fluorescent Coating Material>

The fluorescent coating material according to the present embodiment contains fluorescent particles and a curable resin component.

A content of the fluorescent particles in all non-volatile components of the fluorescent coating material according to the present embodiment is equal to or more than 25 vol % and equal to or less than 60 vol %.

The fluorescent coating material according to the present embodiment contains a curable "resin component" instead of a glass binder. Therefore, by using the fluorescent coating material according to the present embodiment, the fluorescent layer 36 can be provided relatively easily without requiring sintering at a high temperature.

The "without requiring sintering at a high temperature" means that fluorescent substances which can be used are not limited. Specifically, in a case of obtaining a cured film with the glass binder, baking at a high temperature of approximately 600° C. is required. In a case where such a high temperature is required, it is necessary to select a fluorescent substance which can withstand high temperature, so that fluorescent substances which can be used are limited. In addition, peeling is likely to occur during cooling from the high temperature. However, by preparing a fluorescent coating material using the curable resin component, it is possible to form the fluorescent layer 36 which does not easily peel off without requiring a high temperature of approximately 600° C.

The "without requiring sintering at a high temperature" also leads to advantage that there are few restrictions such as heat resistance and optimization of expansion coefficient of a housing or board on which the coating material is applied or printed.

In addition, by using the curable resin component, it is easy to form a moderately thin fluorescent layer 36 by coating or printing. This is particularly effective in a case where the content of the fluorescent particles in the fluorescent coating material is high.

The present inventor sets the content of the fluorescent particles in all non-volatile components of the fluorescent coating material to be equal to or more than 25 vol %, so that light emitted from the light emitting diode element can be sufficiently converted into fluorescence and the light emitted from the light emitting diode element does not pass through the fluorescent layer 36.

By setting the content of the fluorescent particles in all non-volatile components of the fluorescent coating material to be equal to or more than 25 vol %, it is possible to obtain merits other than that the light emitted from the light emitting diode element can be sufficiently converted into the fluorescence.

One example of such merits is improved coating or printing suitability. In a case where the content of the fluorescent particles in the fluorescent coating material is moderately high, the fluorescent coating material is difficult to flow moderately, and as a result, it is easy to form the fluorescent layer 36 with a moderate film thickness.

In addition, by setting the content of the fluorescent particles in all non-volatile components of the fluorescent coating material to be equal to or more than 25 vol %, there is also merit that cracks are less likely to occur in the fluorescent layer 36.

It is considered that one of causes of the crack generation is a difference in coefficient of thermal expansion between the fluorescent layer 36 and the insulating layer 32 on which the fluorescent layer 36 is provided. By setting the content of the fluorescent particles in all non-volatile components of the fluorescent coating material to be equal to or more than 25 vol %, the curable resin component is relatively reduced. Therefore, the difference between the coefficient of thermal expansion of the fluorescent layer 36 and the coefficient of thermal expansion of the insulating layer 32 on which the fluorescent layer 36 is provided is reduced. As a result, cracks are less likely to occur in the fluorescent layer 36.

The content of the fluorescent particles in all non-volatile components of the fluorescent coating material is preferably equal to or more than 30 vol % and more preferably equal to or more than 35 vol %. By doing so, for example, even in a case where a thickness of the fluorescent layer 36 is small, the light emitted from the light emitting diode element 20 can be sufficiently converted into the fluorescence, or color temperature of the light emitted from the light emitting diode element 20 can be greatly converted.

On the other hand, in a case where the content of the fluorescent particles in all non-volatile components of the fluorescent coating material is too high, the fluorescent particles tend to fall off from the formed fluorescent layer 36. Therefore, the content of the fluorescent particles in all non-volatile components of the fluorescent coating material is set to be equal to or less than 60 vol %.

Hereinafter, components and physical properties of the fluorescent coating material according to the present embodiment will be described.

(Fluorescent Particles)

The fluorescent coating material according to the present embodiment contains fluorescent particles. It is sufficient that the fluorescent particles emit fluorescence by the light emitted from the light emitting diode element. Depending on the desired hue, color temperature, and the like, only one type of specific fluorescent particles may be used, or two or more fluorescent particles may be used in combination.

In the present embodiment, in a case where a fluorescence peak wavelength of the above-described fluorescent particles when the luminescence of the light emitting diode element 20 is used as excitation light is denoted as $\lambda 1$ and a luminescence wavelength of the light emitting diode element 20 is denoted as $\lambda 2$, an absolute value $\Delta\lambda$ of a difference between $\lambda 1$ and $\lambda 2$ is preferably equal to or less than 50 nm, more preferably equal to or less than 30 nm, and most preferably equal to or less than 20 nm. The lower limit value of the absolute value $\Delta\lambda$ is not particularly limited, and may be 0, that is, $\lambda 1$ and $\lambda 2$ may coincide.

In a case where the absolute value $\Delta\lambda$ is within the above-described range, since a luminescence wavelength from the fluorescence printed wiring board 30 approximates luminescence wavelength from the light emitting diode element 20, the luminescence of the light emitting module 12 as a whole can be adjusted to a designed color temperature.

Examples of the fluorescent particles include one or two or more kinds selected from the group consisting of a CASN-based fluorescent substance, an SCASN-based fluorescent substance, a $La_3Si_6N_{11}$-based fluorescent substance, a $Sr_2Si_5N_8$-based fluorescent substance, a $Ba_2Si_5Ne$-based fluorescent substance, an $\alpha$-sialon-based fluorescent substance, a $\beta$-sialon-based fluorescent substance, a LuAG-based fluorescent substance, and a YAG-based fluorescent substance. These fluorescent substances usually contain activating elements such as Eu and Ce.

The CASN-based fluorescent substance (a kind of nitride fluorescent substance) preferably contains Eu. The CASN-based fluorescent substance is represented by, for example, a formula $CaAlSiN_3:Eu^{2+}$, and refers to a red fluorescent substance which uses $Eu^{2+}$ as an activator and has crystals including alkaline earth silicon nitride as a matrix.

In the present specification, the definition of CASN-based fluorescent substance containing Eu excludes an SCASN-based fluorescent substance containing Eu.

The SCASN-based fluorescent substance (a kind of nitride fluorescent substance) preferably contains Eu. The SCASN-based fluorescent substance is represented by, for example, a formula $(Sr, Ca) AlSiN_3:Eu^{2+}$, and refers to a red fluorescent substance which uses $Eu^{2+}$ as an activator and has crystals including alkaline earth silicon nitride as a matrix.

The $La_3Si_6N_{11}$-based fluorescent substance is specifically a $La_3Si_6N_{11}$:Ce fluorescent substance and the like. This typically converts a wavelength of blue light from a blue LED to a wavelength of yellow light.

The $Sr_2Si_5N_8$-based fluorescent substance is specifically a $Sr_2Si_5N_8:Eu^{2+}$ fluorescent substance, a $Sr_2Si_5N_B:Ce^{3+}$ fluorescent substance, and the like. These typically convert a wavelength of blue light from a blue LED to wavelengths of yellow to red light.

The $Ba_2Si_5N_8$-based fluorescent substance is specifically a $Ba_2Si_5N_8$:Eu fluorescent substance and the like. This typically converts a wavelength of blue light from a blue LED to wavelengths of orange to red light.

The $\alpha$-sialon-based fluorescent substance preferably contains Eu. The $\alpha$-sialon containing Eu is represented by, for example, a general formula $M_xEu_ySi_{12-(m+n)}Al_{(m+n)}O_nN_{16-n}$. In the general formula, M is one or more elements selected from the group consisting of Li, Mg, Ca, Y, and lanthanide elements (excluding La and Ce), including at least Ca, and in a case where a valence of M is defined as a, ax+2y=m, x satisfies $0<x\leq1.5$, $0.3\leq m<4.5$, and $0<n<2.25$.

The S-sialon-based fluorescent substance preferably contains Eu. The β-sialon containing Eu is represented by, for example, a general formula $Si_{6-z}Al_zO_zN_{8-z}:Eu^{2+}$ (0<Z≤4.2), and is a fluorescent substance including β-sialon in which $Eu^{2+}$ is solid-dissolved. In the general formula, the Z value and the content of europium are not particularly limited. The Z value is, for example, more than 0 and equal to or less than 4.2, and from the viewpoint of further improving luminescence intensity of the S-sialon, it is preferably equal to or more than 0.005 and equal to or less than 1.0. In addition, the content of europium is preferably equal to or more than 0.1% by mass and equal to or less than 2.0% by mass.

The LuAG-based fluorescent substance generally means a lutetium-aluminum garnet crystal. In consideration of application to the illumination device, LuAG is preferably a LuAG:Ce fluorescent substance. More specifically, LuAG can be represented by a composition formula of $Lu_3Al_5O_{12}$:Ce, but the composition of LuAG does not necessarily follow stoichiometry.

The YAG-based fluorescent substance generally means an yttrium-aluminum garnet crystal. In consideration of application to the illumination device, the YAG-based fluorescent substance is preferably Ce-activated. More specifically, the YAG-based fluorescent substance can be represented by a composition formula of $Y_2Al_5O_{12}$:Ce, but the composition of the YAG-based fluorescent substance does not necessarily follow stoichiometry.

A commercially available product may be used as the fluorescent particles. Examples of commercially available fluorescent particles include ALONBRIGHT (registered trademark) manufactured by Denka Company Limited. In addition, the fluorescent particles are commercially available from Mitsubishi Chemical Corporation and the like.

A median diameter $D_{50}$ of the fluorescent particles is preferably equal to or more than 1 μm and equal to or less than 20 μm, more preferably equal to or more than 5 μm and equal to or less than 15 μm. By appropriately adjusting the median diameter $D_{50}$, for example, fluidity as a fluorescent coating material is adjusted, and it is easier to form a thin and uniform coating film.

In a particle size distribution curve of the fluorescent particles, it is preferable that two or more maxima are observed. Specifically, it is preferable that the maxima are observed in both a region of a particle size of equal to or more than 1 μm and equal to or less than 6 μm and a region of a particle size of equal to or more than 10 μm and equal to or less than 25 μm. The presence of two or more maxima means that the fluorescent particles contain both large particles and small particles. Since the small particles enter "gap" between the large particles, it is easier to increase the content of the fluorescent particles than a case where only the large particles are used. In addition, even in a case where the content of the fluorescent particles is increased, it is easy to maintain various physical properties as a coating material. Furthermore, in a case of being formed into a coating film, the light emitted from the light emitting diode element is more difficult to transmit.

The median diameter $D_{50}$ and the particle size distribution curve of the fluorescent particles can be adjusted by devising a method for preparing the fluorescent particles, appropriately pulverizing the fluorescent particles, appropriately mixing two or more fluorescent particles having different particle sizes, and the like.

The particle size distribution curve of the fluorescent particles can be measured by a laser diffraction and scattering particle size distribution analyzer, after dispersing raw fluorescent particles in a dispersion medium using an ultrasonic homogenizer. Thereafter, the median diameter $D_{50}$ can be obtained from the obtained particle size distribution curve. The details of the dispersion processing and the measuring device can be referred to Examples described later.

Just to be sure, in the present specification, the median diameter $D_{50}$ and the particle size distribution curve are measured on a volume basis.

The fluorescent coating material according to the present embodiment may contain only one type of fluorescent particles, or may contain two or more types thereof.

As described above, the content of the fluorescent particles in all non-volatile components of the fluorescent coating material is equal to or more than 25 vol % and equal to or less than 60 vol %. The content is preferably equal to or more than 30 vol % and equal to or less than 60 vol %, more preferably equal to or more than 35 vol % and equal to or less than 60 vol %, and still more preferably equal to or more than 40 vol % and equal to or less than 50 vol %.

(Curable Resin Component)

The fluorescent coating material according to the present embodiment contains a curable resin component. A fluorescent layer obtained by curing the fluorescent coating material contains an organic binder resin.

In the present specification, the "curable resin component" includes not only (1) a resin (polymer) component which has property of being cured by action of heat, light, and the like, but also (2) a component which is a monomer or an oligomer before coating film formation, but can form a resin (polymer) by increasing a molecular weight by the action of heat, light, and the like after coating film formation.

In connection with the above, in the present specification, a polymerization initiator, a curing agent, and the like are also included a part of the "curable resin component", in addition to the polymer, and the monomer or the oligomer.

In a case where the curable resin component includes the resin, the monomer, or the oligomer, these substances are usually an organic substance. That is, the curable resin component typically includes an organic resin, an organic monomer, or an organic oligomer.

The curable resin component preferably includes a thermosetting resin component. As a result, an illumination device with high durability can be manufactured. Needless to say, depending on the purpose and application, the curable resin component may include a thermoplastic resin.

The curable resin component preferably includes one or two or more kinds selected from the group consisting of a silicone resin and a (meth)acrylate monomer. Among these, from the viewpoint of heat resistance and durability, a silicone resin (a resin having a siloxane bond as a main skeleton) is preferable.

It is preferable that the curable resin component includes a silicone resin having a phenyl group and/or a methyl group. Such a silicone resin is preferable from the viewpoint of compatibility with other components, solvent solubility, coatability, heat resistance, durability, and the like. A ratio of phenyl group:methyl group in the resin is, for example, approximately 0.3:1 to 1.5:1.

The curable resin component can contain a reactive group. As a result, the curable resin component itself can be cured. As an example, the curable resin component preferably includes a silicone resin having a silanol group (—Si—OH). As a result, a condensation reaction of silanol groups occurs during the coating film formation, and a cured coating film is obtained. A silanol content (OH % by mass) of the silicone resin having a silanol group (—Si—OH) is, for example, equal to or more than 0.1% by mass and equal to or less than 5% by mass.

As another example, the curable resin component may be a compound (addition reaction type) that cures through a hydrosilylation reaction between a vinyl group-containing polymer and a Si—H group-containing silicone polymer.

A weight-average molecular weight of the resin included in the curable resin component is not particularly limited. Any resin having a weight-average molecular weight can be included as long as it can be used as a coating material for forming a coating film.

As an example, the weight-average molecular weight of the resin included in the curable resin component is generally equal to or more than 1,000 and equal to or less than 1,000,000, preferably equal to or more than 1,000 and equal to or less than 500,000.

In a case where a commercially available product is used as the resin included in the curable resin component, catalog data can be used as the weight-average molecular weight of the resin. In a case where the weight-average molecular weight is unknown from a catalog or the like, the weight-average molecular weight can be determined by, for example, gel permeation chromatography (GPC) measurement using polyethylene as a standard substance.

A commercially available product may be used as the resin included in the curable resin component.

A commercially available product of the silicone resin is available, for example, from Dow Toray Co., Ltd., Shin-Etsu Chemical Co., Ltd., and the like. Examples thereof include RSN-0409, RSN-0431, RSN-0804, RSN-0805, RSN-0806, RSN-0808, RSN-0840, and the like (manufactured by Dow Toray Co., Ltd.); and KF-8010, X-22-161A, KF-105, X-22-163A, X-22-169AS, KF-6001, KF-2200, X-22-164A, X-22-162C, X-22-167C, X-22-173BX, and the like (manufactured by Shin-Etsu Chemical Co., Ltd.).

As described above, the curable resin component may include a monomer or an oligomer rather than the resin.

For example, the curable resin component preferably includes a (meth)acrylate monomer. The (meth)acrylate monomer may be monofunctional or polyfunctional. The (meth)acrylate monomer preferably has equal to or more than 2 and equal to or less than 6 of (meth)acrylic structures in one molecule.

The curable resin component preferably includes a polymerization initiator together with the monomer or the oligomer.

For example, in a case where the curable resin component includes a (meth)acrylate monomer, it is preferably to use a radical polymerization initiator in combination. The radical polymerization initiator generates radicals by heat or actinic rays.

The curable resin component may be any component known in the field of coating material, in addition to the silicone resin as described above, or the combination of the (meth)acrylate monomer and the polymerization initiator. The curable resin component may be, for example, (i) a urethane-based component including a polyol and a polyisocyanate, (ii) an epoxy-based component, or the like.

Examples of the (i) polyol include (meth)acrylic polyol, polyester polyol, polyether polyol, epoxy polyol, polyolefin-based polyol, fluorine-containing polyol, polycaprolactone polyol, polycaprolactam polyol, and polycarbonate polyol.

Preferred examples of the (i) polyisocyanate include difunctional to hexafunctional polyisocyanate, and more preferred examples thereof include difunctional to tetrafunctional polyisocyanate. Specific examples thereof include aliphatic diisocyanate, cycloaliphatic diisocyanate, isocyanurate and biuret-type adducts which are a multimer of an isocyanate compound, and compounds obtained by adding an isocyanate compound to a polyhydric alcohol or a low-molecular-weight polyester resin. Biuret-type, isocyanurate-type, adduct-type, and allophanate-type polyisocyanates are also known. Any of these can be used.

The (i) polyisocyanate may be a so-called blocked isocyanate. In other words, a part or all of isocyanate groups of the polyisocyanate may be in a form of blocked isocyanate groups blocked by a protective group. For example, an isocyanate group is blocked by an active hydrogen compound such as an alcohol-based compound, a phenol-based compound, a lactam-based compound, an oxime-based compound, and an active methylene-based compound to form a blocked isocyanate group.

Examples of a commercially available product of the polyisocyanate include Duranate (trade name) series manufactured by Asahi Kasei Corporation, TAKANATE (trade name) series manufactured by Mitsui Chemicals, Inc., and Desmodur (trade name) series manufactured by Sumitomo Bayer Urethane Co., Ltd.

The (ii) epoxy-based curable resin component generally includes an epoxy resin and its curing agent.

Examples of the epoxy resin include a bisphenol A-type epoxy resin, a halogenated bisphenol A-type epoxy resin, a novolac-type epoxy resin, a polyglycol-type epoxy resin, a bisphenol F-type epoxy resin, an epoxidized oil, 1,6-hexanediol diglycidyl ether, and neopentyl glycol diglycidyl ether.

Usually, examples of the curing agent include polyamines such as a polyvalent amine, an amine adduct, and a polyamide, and acid anhydrides.

The fluorescent coating material according to the present embodiment may contain only one type of curable resin component, or may contain two or more types thereof.

An amount of the curable resin component in the fluorescent coating material according to the present embodiment in all non-volatile components is preferably equal to or more than 40 vol % and equal to or less than 65 vol %, and more preferably equal to or more than 45 vol % and equal to or less than 60 vol %.

(Fluidity Modifier)

The fluorescent coating material according to the present embodiment preferably contains a fluidity modifier. As a result, in some cases, it is possible to adjust fluidity characteristics of the coating material and adjust coatability.

As the fluidity modifier, silica particles such as hydrophobic silica and hydrophilic silica, aluminum oxide, and the like can be used. In particular, fumed silica is preferably used.

Examples of a commercially available fluidity modifier include AEROSIL 130, AEROSIL 200, AEROSIL 300, AEROSIL R-972, AEROSIL R-812, AEROSIL R-812S, and Alminium Oxide C (manufactured by NIPPON AEROSIL CO., LTD.; AEROSIL is registered trademark), and Carplex FPS-1 (manufactured by DSL Chemicals Co., Ltd., trade name).

In a case where the fluorescent coating material according to the present embodiment contains a fluidity modifier, the fluorescent coating material according to the present embodiment may contain only one type of fluidity modifier, or may contain two or more types of fluidity modifiers.

In a case where the fluorescent coating material according to the present embodiment contains a fluidity modifier, an amount thereof in all non-volatile components is, for example, equal to or less than 10 vol %, preferably equal to or more than 1 vol % and equal to or less than 5 vol %. On a mass basis rather than a volume basis, the amount of the fluidity modifier in all non-volatile components is, for example, equal to or less than 5% by mass, preferably equal to or more than 0.1% by mass and equal to or less than 5% by mass.

(Solvent)

The fluorescent coating material according to the present embodiment preferably contains a solvent. As a result, it is possible to obtain a fluorescent coating material with favorable coatability. The solvent includes water and/or an organic solvent.

Examples of the organic solvent include a hydrocarbon-based solvent, a ketone-based solvent, an ester-based solvent, an alcohol-based solvent, an amide-based solvent, and an ether-based solvent.

Preferred examples of the organic solvent include an alcohol-based solvent. Specific examples thereof include methanol, ethanol, n-propanol, 2-propanol, n-butanol, 2-butanol, and t-butanol. In addition, preferred examples thereof also include ether bond-containing alcohols such as butyl carbitol (diethylene glycol monobutyl ether) and ethyl carbitol (diethylene glycol monoethyl ether). In particular, in a case where the silicone resin is used as the resin, these are preferable in that the silicone resin can be well dissolved and dispersed to prepare a fluorescent coating material with favorable coatability.

In addition, the solvent preferably includes an aromatic hydrocarbon solvent. In particular, in a case where the silicone resin is used, by using the aromatic hydrocarbon solvent in combination, it is easy to prepare a fluorescent coating material having a favorable balance of properties. Examples of the aromatic hydrocarbon solvent include toluene and xylene.

In a case of using a solvent, only one type of solvent may be used, or two or more types of solvents may be used in combination. For example, the alcohol-based solvent and the aromatic hydrocarbon solvent described above may be used in combination. In a case of using solvents in combination, from the viewpoint of sufficiently obtaining effect of the combined use, each solvent is preferably present in an amount of at least 1% by mass of the total amount of the solvents.

In a case where the fluorescent coating material according to the present embodiment contains a solvent, it is preferable that the solvent is contained in such an amount that the non-volatile component concentration is equal to or less than 90% by mass. However, the non-volatile component concentration is not limited to this, and the amount may be appropriately adjusted as long as the coating film can be formed.

(Other Components)

The fluorescent coating material according to the present embodiment may contain a component other than the above-described components. Examples of other components include an antirust pigment, an extender pigment, a surface conditioner, a wax, a defoaming agent, a dispersant, an ultraviolet absorber, a light stabilizer, an antioxidant, a leveling agent, an anti-wrinkling agent, a plasticizer, and a charge control agent.

(Viscosity)

It is preferable that a viscosity of the fluorescent coating material according to the present embodiment is appropriately adjusted. Appropriate viscosity further improves coatability, facilitates formation of a thin coating film, and the like.

Specifically, the viscosity of the fluorescent coating material, measured at 25° C. and a rotation speed of 20 rpm using a B-type viscometer, is preferably equal to or more than 60 dPs·s and equal to or less than 500 dPa·s, and more preferably equal to or more than 80 dPs·s and equal to or less than 400 dPa·s. By setting the viscosity to such a value, film formability can be enhanced particularly in a case where a coating film is formed by a screen printing method. In a case where the coating film is formed by a method other than the screen printing method, the preferred viscosity may differ from the above-described numerical range.

(Form of Coating Material)

The fluorescent coating material according to the present embodiment may be of a one-liquid type or a multi-liquid type of two or more liquids. Specifically, the fluorescent coating material according to the present embodiment can be supplied as a one-liquid type composition in which all of the necessary components are uniformly mixed or dispersed. In addition, the fluorescent coating material according to the present embodiment may be supplied as a two-liquid type (two-liquid kit) of a liquid A including some of the components and a liquid B including the remaining components.

From the viewpoint of storage stability before coating, in some cases, it is preferable to use a multi-liquid type fluorescent coating material.

In a case where the fluorescent coating material according to the present embodiment is of a multi-liquid type, immediately before forming the coating film, each liquid is uniformly mixed to obtain a coating material for coating. In the coating material for coating, the content of the fluorescent particles in all non-volatile components is equal to or more than 25 vol % and equal to or less than 50 vol %.

The fluorescent printed wiring board 30 which includes the fluorescent layer 36 containing the fluorescent particles can be manufactured using the above-described fluorescent coating material.

The coating method is not particularly limited. For example, the coating material composition may be applied using various coaters known in the field of coating material. Alternatively, the coating material composition may be applied by a printing method such as screen printing.

It is preferable to perform a drying treatment or a curing treatment after the coating. Conditions for the drying treatment are, for example, equal to or higher than 60° C. and equal to or lower than 100° C. for equal to or more than 15 minutes and equal to or less than 60 minutes. Conditions for the curing treatment are, for example, equal to or higher than 100° C. and equal to or lower than 200° C. for equal to or more than 30 minutes and equal to or less than 240 minutes.

A coating amount of the fluorescent coating material is adjusted so that the thickness of the fluorescent layer 36 is preferably equal to or less than 150 μm, more preferably equal to or more than 30 μm and equal to or less than 100 μm, and still more preferably equal to or more than 30 μm and equal to or less than 80 μm.

By setting the content of the fluorescent particles in the fluorescent coating material to be equal to or more than 25 vol %, preferably equal to or more than 30 vol % and more preferably equal to or more than 35 vol %, even in a case where the thickness of the fluorescent layer 36 is equal to or less than 150 μm, the light emitted from the light emitting diode element 20 can be sufficiently converted into fluorescence, and the light emitted from the light emitting diode element 20 does not easily pass through the fluorescent layer.

Light Emitting Operation of Light Emitting Printed Wiring Board of Present Embodiment Next, a light emitting operation of a light emitting printed wiring board 10 according to the present embodiment will be described with reference to FIG. 21. Here, FIG. 21 is a diagram for explaining a light emitting operation of the light emitting module 12, and a light emitting operation of a plurality of light emitting diode elements 20 will be illustrated.

First, in a case where an operation switch (for example, function of the drive circuit) which operates the light emitting diode elements 20 is turned on, power supply to the electrode layer 34 is started from a commercial alternating current power supply AC through the drive circuit, and the plurality of light emitting diode elements 20 emit a light L in a radially divergent manner. A part of the light L reaches the front surface 31 of the fluorescent printed wiring board 30. Hereinafter, the behavior of the light L will be described in terms of a traveling direction of the emitted light L.

A part of the light L emitted from each light emitting diode element 20 is emitted outside without entering the fluorescent layer 36. In this case, a wavelength of the light L remains the same as a wavelength of the light L emitted from each light emitting diode element 20.

In addition, light of the LED 22 itself, included in the light L emitted from each light emitting diode element 20, enters the fluorescent layer 36. Here, the "light of the LED 22 itself, included in the light L" described above is light of the emitted light L which is not color-converted by the fluorescent substance of each light emitting diode element 20 (CSP itself), that is, light of the LED 22 itself (for example, blue color (wavelength is approximately 470 nm) light).

In a case where the light L of the LED 22 itself collides with the fluorescent substance dispersed in the fluorescent layer 36, the fluorescent substance is excited and emits excitation light. Here, the reason why the fluorescent substance is excited is that a fluorescent substance having an excitation peak in blue light (visible light-excitation fluorescent substance) is used as the fluorescent substance dispersed in the fluorescent layer 36. Accordingly, a part of energy of the light L is used to excite the fluorescent substance, and the light L loses a part of its energy. As a result, the wavelength of the light L is converted (wavelength conversion occurs). For example, depending on the type of the fluorescent substance in the fluorescent layer 36 (for example, in a case where red CASN is used as the fluorescent substance), the wavelength of the light L becomes longer (for example, 650 nm or the like).

In addition, a part of the excitation light from the fluorescent layer 36 is emitted from the fluorescent layer 36 as it is, but a part of the excitation light is directed toward the lower electrode layer 34. A part of the excitation light is emitted to the outside by reflection on the electrode layer 34. As described above, in a case where the wavelength of the excitation light from the fluorescent substance is equal to or more than 600 nm, the reflection effect can be expected even in a case where the electrode layer 34 is made of Cu. The wavelength of the light L differs from that in the above-described example depending on the type of the fluorescent substance of the fluorescent layer 36, but the wavelength conversion of the light L occurs in any case. For example, in a case where the wavelength of the excitation light is less than 600 nm, the reflection effect can be expected, for example, in a case where the electrode layer 34 or its surface is made of Ag (plating). In addition, a reflective layer may be provided on the lower side (insulating layer 32 side) of the fluorescent layer 36. The reflective layer is provided with, for example, a white coating material such as a titanium oxide filler.

As described above, the light L emitted from each light emitting diode element 20 (the light L emitted from each light emitting diode element 20 in radial) illuminates the outside together with the above-described excitation light through a plurality of optical paths as described above. Therefore, in a case where the luminescence wavelength of the fluorescent substance contained in the fluorescent layer 36 and the luminescence wavelength of the fluorescent substance sealing (or covering) the LED 22 in the light emitting diode element 20 (CSP) are different from each other, the light emitting printed wiring board 10 according to the present embodiment illuminates, together with the above-described excitation light, a flux of the light L in a case of being emitted from each light emitting diode element 20 as a flux of the light L including the light L having a wavelength different from the wavelength of the light L in a case of being emitted from each light emitting diode element 20. For example, the light emitting module 12 according to the present embodiment illuminates, together with the above-described excitation light, a flux of the light L in a case of being emitted from each light emitting diode element 20 as a flux of the light L including the light L having a longer wavelength than the wavelength of the light L in a case of being emitted from each light emitting diode element 20.

On the other hand, in a case where the luminescence wavelength of the fluorescent substance contained in the fluorescent layer 36 and the luminescence wavelength of the fluorescent substance sealing (or covering) the LED 22 in the light emitting diode element 20 (CSP) are the same (in a case of the same correlated color temperature), the light emitting module 12 according to the present embodiment illuminates, together with the above-described excitation light, a flux of the light L in a case of being emitted from each light emitting diode element 20 as a flux of the light L including the light L having the same wavelength as the wavelength of the light L in a case of being emitted from each light emitting diode element 20.

The above is the description of the light emitting operation of the light emitting module 12 according to the present embodiment.

Effects of First Embodiment

Next, the effects of the present embodiment will be described with reference to the drawings.

As shown in FIG. 1, light distribution characteristics are confirmed using a road lamp in which the road illumination device 100 is supported by a pillar P having a length of 10 m. The experimental results are shown in FIGS. 22($a$), 22($b$), and 22 ($c$).

Light distribution data (IES data) is obtained by measuring with NeoLight 9500 manufactured by PIMACS CO., LTD., and optical simulations are performed using ZEMAX and DIALux.

FIGS. 22($a$), 22($b$), and 22($c$) show cross-sectional views of the road illumination device 100. The cross-sectional views are a cross-sectional view of the light source unit 10 in FIG. 3 taken along the line A-A', as shown in FIG. 4.

In FIG. 22($a$), the first light emitting module 12$a$ and the second light emitting module 12$b$ are arranged along the lateral direction as shown in FIG. 17, and a thickness d of the light-transmissive cover (light distribution adjustment portion 14) is made uniform. The thickness d is 1.75 mm.

In FIG. 22($b$), the first light emitting module 12$a$ and the second light emitting module 12$b$ are arranged along the lateral direction as shown in FIG. 17. The light-transmissive cover (light distribution adjustment portion 14) has the structure shown in FIG. 10, and the thickness d2 at the top portion b is 1.75 mm and the thickness d1 at the end portion a is 17.6 mm.

FIG. 22(c) is the same as FIG. 22(b), except that the first light emitting module 12a and the second light emitting module 12b are arranged along the longitudinal direction as shown in FIG. 18.

As shown in the light distribution diagram (third low), the road illumination device 100 provided with the light source unit 10 of FIG. 22(a) can set the illumination range to a predetermined circular range, and the illuminance is high as shown in the illuminance distributions (fourth and fifth lows).

On the other hand, the road illumination devices 100 provided with the light source units 10 of FIGS. 22(b) and 22(c) have a badwing-shaped illumination range, which can illuminate a wider range and is particularly suitable for an illumination device for vehicle road.

Second Embodiment

The road illumination device according to the present embodiment is the same as that of the first embodiment except for the shape of the light distribution adjustment portion 14 constituting the light source unit 10 and the arrangement of the light emitting modules 12, and thus descriptions thereof will not be repeated.

Unlike the first embodiment, the light source unit 10 according to the embodiment distributes the emission light from the light emitting diode element and the luminescence from the fluorescent layer in a batwing-type illuminance distribution by arranging the light emitting modules.

FIGS. 23(a) and 23(b) show cross-sectional views of the light source unit 10 according to the present embodiment in the cross-sectional view of the illumination device 100 for road of FIG. 3 along the line A-A'. In FIGS. 23(a) and 23(b), the illustration of the upper body case 102 and the window portion 104 will not be repeated.

Same as in the first embodiment, examples of the shape of the light distribution adjustment portion 14 include a semi-cylindrical shape and a bowl-like shape. The thickness of the light distribution adjustment portion 14 is substantially the same throughout, and is approximately 1.75 mm.

As shown in FIGS. 23(a) and 23(b), the light emitting module 12 includes a first light emitting module 12a and a second light emitting module 12b. The first light emitting module 12a and the second light emitting module 12b do not exist on the same plane, but are arranged along the lateral direction of the light source unit 10.

The badwing-shaped light distribution can be obtained by changing an angle β formed by a back surface of a mounting surface of the light emitting diode element 20 in the first light emitting module 12a and a back surface of a mounting surface of the light emitting diode element 20 in the second light emitting module 12b, and the angle is equal to or more than 0° and equal to or less than 120°, preferably equal to or more than 0° and equal to or less than 90° and more preferably equal to or more than 0° and equal to or less than 60°. FIG. 23(b) shows a case where the angle D is 0°.

The light distribution adjustment portion 14 according to the first embodiment can be used instead of the light distribution adjustment portion 14 in the light source unit 10 according to the present embodiment.

Effects of Second Embodiment

Next, the effects of the present embodiment will be described with reference to the drawings.

As shown in FIG. 1, light distribution characteristics are confirmed using a road lamp in which the road illumination device 100 is supported by a pillar P having a length of 10 m. The experimental results are shown in FIGS. 24(a), 24(b), 24(c), and 24 (d).

FIGS. 24(a), 24(b), 24(c), and 24(d) show cross-sectional views of the road illumination device 100. The cross-sectional views are a cross-sectional view of FIG. 3 taken along the line A-A', as shown in FIG. 4.

In FIG. 24(a), the first light emitting module 12a and the second light emitting module 12b are arranged along the lateral direction as shown in FIG. 17, and a thickness d of the light-transmissive cover (light distribution adjustment portion 14) is made uniform.

FIG. 24(b) is the same as FIG. 24(a), except that the angle β between the first light emitting module 12a and the second light emitting module 12b is set to 120°.

FIG. 24(c) is the same as FIG. 24(a), except that the angle β between the first light emitting module 12a and the second light emitting module 12b is set to 60°.

FIG. 24(d) is the same as FIG. 24(a), except that the angle β between the first light emitting module 12a and the second light emitting module 12b is set to 0°.

As shown in the light distribution diagram (second low), the road illumination devices 100 of FIGS. 24(a) and 24(b) can set the illumination range to a predetermined circular range, and the illuminance is high as shown in the illuminance distributions (third low).

As the angle β is smaller, the illuminance distribution widens, and the road illumination devices 100 of FIGS. 24(c) and 24(d) have a badwing-shaped illumination range, which can illuminate a wider range and is particularly suitable for an illumination device for vehicle road.

The embodiments according to the present invention have been described above; however, these are examples according to the present invention, and thus it is possible to adopt various configurations other than the above within the scope that does not impair the effects of the present invention.

Priority is claimed on Japanese Patent Application No. 2021-047599, filed Mar. 22, 2021, the disclosure of which is incorporated herein by reference.

REFERENCE SIGNS LIST 100 road illumination device
P pillar
a directly below region
b peripheral region
101 lower body case
101a groove
102 upper body case
102a first case portion
102b second case portion
103 pillar coupling portion
104 window portion
10 light source unit
11 body
12 light emitting module
14 light distribution adjustment portion
14a light receiving surface
14b emission surface
14b1 mountain portion
14b2 valley portion
16 heat sink
18 body portion
18a screw portion
19 cooling fan 20 light emitting diode element
22 LED
31, 32a, 34a front surface
32 insulating layer
33 back surface
34 electrode layer
34A electrode pair
34B wiring portion
36 fluorescent layer

The invention claimed is:

1. A light source unit comprising:
a light emitting module which has a printed wiring board and a plurality of light emitting diode elements mounted on the printed wiring board; and
a light-transmissive light distribution adjustment portion which covers the light emitting module,
wherein the printed wiring board has a fluorescent layer containing fluorescent particles over a surface on which the light emitting diode elements are mounted,
the light distribution adjustment portion includes a portion having a convex shape outward from the board side, is spaced apart from the plurality of light emitting diode elements and from the fluorescent layer, commonly covers the plurality of light emitting diode elements and the fluorescent layer, and diffuses and distributes emission light from the light emitting diode elements and luminescence from the fluorescent layer,
each of the light emitting diode elements is a Chip Scale Package (CSP) in which a flip chip is incorporated, and a fluorescent substance of the CSP is provided separately from the fluorescent layer, and
the fluorescent layer is provided in an area of 80% or more of an surface of an insulation layer of the printed wiring board.

2. The light source unit according to claim 1,
wherein the light distribution adjustment portion emits the emission light from the light emitting diode elements and the luminescence from the fluorescent layer, and distributes the light in a batwing-type illuminance distribution.

3. The light source unit according to claim 1,
wherein the light distribution adjustment portion includes a convex curved surface protruding outward from the board side.

4. The light source unit according to claim 3,
wherein the light distribution adjustment portion has a bowl-like shape or a semi-cylindrical shape.

5. The light source unit according to claim 3,
wherein the printed wiring board has a rectangular shape,
an emission surface of the light distribution adjustment portion, which emits the emission light from the light emitting diode elements and the luminescence from the fluorescent layer, is a convex curved surface, and
in a cross-sectional view along a plane orthogonal to a longitudinal direction of the board and a surface direction of the board and passing through a center portion of the board, in a case where a thickness of the light distribution adjustment portion in a normal direction of the convex curved surface is denoted as d, a thickness d at an end portion of the convex curved surface is larger than a thickness d at a top portion of the convex curved surface.

6. The light source unit according to claim 5,
wherein a value of the thickness d gradually increases from the top portion of the convex curved surface to the end portion of the convex curved surface.

7. The light source unit according to claim 1,
wherein the light distribution adjustment portion includes a light receiving surface which receives the emission light from the light emitting diode elements and the luminescence from the fluorescent layer, and an emission surface which emits the received light, and
the emission surface of the light distribution adjustment portion includes irregularities composed of a mountain portion protruding toward outward and a valley portion adjacent to the mountain portion and recessed inward.

8. The light source unit according to claim 1,
wherein the light distribution adjustment portion includes a cylindrical lens portion.

9. The light source unit according to claim 1,
wherein the light distribution adjustment portion includes a Fresnel lens portion.

10. The light source unit according to claim 1,
wherein the light emitting module includes a first light emitting module and a second light emitting module,
the first light emitting module and the second light emitting module do not exist over the same plane, and
an angle formed by a back surface of an element mounting surface of the board in the first light emitting module, on which the light emitting diode elements are mounted, and a back surface of an element mounting surface of the board in the second light emitting module, on which the light emitting diode elements are mounted, is equal to or more than 0° and equal to or less than 120°.

11. The light source unit according to claim 1, further comprising:
a heat sink over a surface side of the board opposite to the surface on which the light emitting diode elements are mounted.

12. The light source unit according to claim 11, further comprising:
a cooling fan.

13. The light source unit according to claim 1,
wherein the fluorescent particles include one or two or more kinds selected from the group consisting of a CASN-based fluorescent substance, an SCASN-based fluorescent substance, a $La_3Si_6N_{11}$-based fluorescent substance, a $Sr_2Si_5N_8$-based fluorescent substance, a $Ba_2Si_5N_8$-based fluorescent substance, an α-sialon-based fluorescent substance, a β-sialon-based fluorescent substance, a LuAG-based fluorescent substance, and a YAG-based fluorescent substance.

14. The light source unit according to claim 1,
wherein a median diameter $D_{50}$ of the fluorescent particles is equal to or more than 1 μm and equal to or less than 20 μm.

15. The light source unit according to claim 1,
wherein a thickness of the fluorescent layer is equal to or less than 150 μm.

16. The light source unit according to claim 1,
wherein the fluorescent layer contains a transparent resin which is transparent to visible light and the fluorescent particles dispersed in the transparent resin.

17. The light source unit according to claim 1,
wherein the fluorescent layer is a cured product of a fluorescent coating material, and
the fluorescent coating material contains fluorescent particles and a curable resin component.

18. The light source unit according to claim 17,
wherein the curable resin component includes one or two or more kinds selected from the group consisting of a silicone resin and a (meth)acrylate monomer.

19. The light source unit according to claim 1,
wherein the light source unit is used for road illumination.

20. The light source unit according to claim 1,
wherein, in a case where a fluorescence peak wavelength of the fluorescent particles when luminescence of the light emitting diode elements is used as excitation light is denoted as $\lambda 1$ and a luminescence wavelength of the light emitting diode elements is denoted as $\lambda 2$, an absolute value $\Delta\lambda$ of a difference between $\lambda 1$ and $\lambda 2$ is equal to or less than 50 nm.

21. The light source unit according to claim 1, further comprising:
a body including the light emitting module,
wherein the light distribution adjustment portion is detachable from the body.

22. The light source unit according to claim 1, further comprising:
an attaching portion for detachably installing the light source unit to a housing of a road illumination device.

23. A road illumination device comprising:
a housing; and
a light source unit housed in the housing,
wherein the housing has a window portion for transmitting light emitted from the light source unit and a light source unit installing portion for installing the light source unit,
the light source unit is the light source unit according to claim 22, and
the light source unit is detachably installed to the light source unit installing portion.

24. A light source unit comprising:
a light emitting module which has a printed wiring board and a plurality of light emitting diode elements mounted on the printed wiring board; and
a light-transmissive light distribution adjustment portion which covers the light emitting module,
wherein the printed wiring board has a fluorescent layer containing fluorescent particles over a surface on which the light emitting diode elements are mounted,
the light emitting module includes a first light emitting module and a second light emitting module,
the first light emitting module and the second light emitting module do not exist over the same plane,
an angle formed by a back surface of a mounting surface of the light emitting diode elements in the first light emitting module and a back surface of a mounting surface of the light emitting diode elements in the second light emitting module is equal to or more than 0° and equal to or less than 120°,
each of the light emitting diode elements is a Chip Scale Package (CSP) in which a flip chip is incorporated, and a fluorescent substance of the CSP is provided separately from the fluorescent layer, and
the fluorescent layer is provided in an area of 80% or more of an surface of an insulation layer of the printed wiring board.

* * * * *